US012751033B2

(12) United States Patent
Kawamura et al.

(10) Patent No.: US 12,751,033 B2
(45) Date of Patent: Sep. 29, 2026

(54) COMPOUND SEMICONDUCTOR SUBSTRATE AND COMPOUND SEMICONDUCTOR DEVICE COMPRISING A Si SUBSTRATE A SiC LAYER, NITRIDE SEMICONDUCTOR LAYERS, AN ELECTRONIC TRAVELING LAYER, AND A BARRIER LAYER

(71) Applicant: AIR WATER INC., Osaka (JP)

(72) Inventors: Keisuke Kawamura, Nagano (JP); Sumito Ouchi, Nagano (JP); Shigeomi Hishiki, Nagano (JP)

(73) Assignee: Air Water Inc., Osaka (JP)

( * ) Notice: Subject to any disclaimer, the term of this patent is extended or adjusted under 35 U.S.C. 154(b) by 493 days.

(21) Appl. No.: 18/023,185

(22) PCT Filed: Aug. 19, 2021

(86) PCT No.: PCT/JP2021/030327
§ 371 (c)(1),
(2) Date: Feb. 24, 2023

(87) PCT Pub. No.: WO2022/044942
PCT Pub. Date: Mar. 3, 2022

(65) Prior Publication Data

US 2023/0343865 A1 Oct. 26, 2023

(30) Foreign Application Priority Data

Aug. 24, 2020 (JP) ................................ 2020-140677

(51) Int. Cl.
*H10D 30/47* (2025.01)
*H10D 62/17* (2025.01)
(Continued)

(52) U.S. Cl.
CPC ......... *H10D 30/475* (2025.01); *H10D 62/357* (2025.01); *H10D 62/8325* (2025.01); *H10D 62/8503* (2025.01)

(58) Field of Classification Search
CPC ........ H01L 21/02458; H01L 21/02381; H10D 30/475; H10D 62/357; H10D 30/061
See application file for complete search history.

(56) References Cited

U.S. PATENT DOCUMENTS

2007/0254431 A1 11/2007 Saito et al.
2009/0065787 A1 3/2009 Kikkawa et al.
(Continued)

FOREIGN PATENT DOCUMENTS

EP 3 366 807 A1 8/2018
JP 2006-517726 A 7/2006
(Continued)

OTHER PUBLICATIONS

International Preliminary Report on Patentability and Written Opinion of the International Searching Authority, issued Feb. 28, 2023 in International Patent Application No. PCT/JP2021/030327.
(Continued)

*Primary Examiner* — Davienne N Monbleau
*Assistant Examiner* — Dmitri Mihaliov
(74) *Attorney, Agent, or Firm* — Wood, Phillips, Katz, Clark & Mortimer

(57) ABSTRACT

A compound semiconductor substrate and a compound semiconductor device with high quality is provided. The compound semiconductor substrate includes a Si substrate with O concentration of $3*10^{17}/cm^3$ or more and $3*10^{18}/cm^3$ or less, a SiC layer formed on the Si substrate, a first nitride semiconductor layer made of $Al_xGa_{1-x}N$ ($0.1 \leq x \leq 1$), formed on the SiC layer and including an insulating or semi-insulating layer, a second nitride semiconductor layer
(Continued)

formed on the first nitride semiconductor layer and containing a C—GaN layer, and an electronic traveling layer formed on the second nitride semiconductor layer and comprising of $Al_zGa_{1-z}N$ ($0 \leq z < 0.1$). The sum total thickness of the first nitride semiconductor layer, the second nitride semiconductor layer and the electronic traveling layer is 6 micrometers or more and 10 micrometers or less.

13 Claims, 19 Drawing Sheets

(51) Int. Cl.
*H10D 62/832* (2025.01)
*H10D 62/85* (2025.01)

(56) References Cited

U.S. PATENT DOCUMENTS

| | | | | |
|---|---|---|---|---|
| 2012/0091435 | A1* | 4/2012 | Ikuta | H10D 62/357 257/E29.024 |
| 2014/0374771 | A1 | 12/2014 | Umeno et al. | |
| 2015/0171173 | A1* | 6/2015 | Umeda | H10D 62/8164 257/194 |
| 2017/0323960 | A1 | 11/2017 | Sato et al. | |
| 2018/0277363 | A1 | 9/2018 | Narukawa et al. | |
| 2020/0020778 | A1* | 1/2020 | Narukawa | H01L 21/02458 |
| 2020/0402922 | A1* | 12/2020 | Ouchi | H10D 30/87 |
| 2022/0028981 | A1* | 1/2022 | Fujikura | H10D 62/824 |
| 2022/0069090 | A1* | 3/2022 | Suzuki | H01L 21/0254 |
| 2022/0077288 | A1* | 3/2022 | Ouchi | H01L 21/0251 |

FOREIGN PATENT DOCUMENTS

| | | | |
|---|---|---|---|
| JP | 2007-294769 | A | 11/2007 |
| JP | 2010-287882 | A | 12/2010 |
| JP | 2020-113693 | A | 7/2020 |
| TW | 201631635 | A | 9/2016 |
| TW | 201929221 | A | 7/2019 |
| WO | 2007-116517 | A1 | 8/2009 |
| WO | 2013-137476 | A1 | 9/2013 |
| WO | 2014-041736 | A1 | 3/2014 |
| WO | 2017-069087 | A1 | 4/2017 |
| WO | 2020149184 | A1 | 7/2020 |

OTHER PUBLICATIONS

Office Action issued Jun. 11, 2024, in Japanese Patent Application No. 2020-140677.

International Search Report, issued Oct. 19, 2021 in International Application No. PCT/JP2021/030327.

Sheppard, S. T. et al., "High-Power Microwave GaN/AlGaN HEMT's on Semi-Insulating Silicon Carbide Substrates", IEEE Electron Device Letters, Apr. 1999, vol. 20, No. 4, pp. 161-163, USA.

Johnson, J. W. et al., "12 W/mm AlGaN HFETs on Silicon Substrates", IEEE Electron Device Letters, Jul. 2004, vol. 25, No. 7, pp. 459-461, USA.

Kikkawa, Toshihide et al, "Highly Uniform AlGaN/GaN Power HEMT on a 3-inch Conductive N-SiC Substrate for Wireless Base Station Application", CSIC 2005 Digest, pp. 77-80, Spain.

Office Action issued Apr. 28, 2025, in TW Patent Application No. 110131060.

Written Opinion for Singapore Application No. 11202301463U mailed Oct. 2, 2025.

* cited by examiner (a)

(b)

(a)

(b)

(a)

(b)

(a)

(b)

| SAMPLE | SAMPLE 10 | SAMPLE 11 |
|---|---|---|
| C-GaN LAYER 51c CONCENTRATION ERROR ΔC | 0% | 258% |
| C-GaN LAYER 51b CONCENTRATION ERROR ΔC | 21% | 312% |
| C-GaN LAYER 51a CONCENTRATION ERROR ΔC | 33% | 448% |

| SAMPLE | SAMPLE 10 | SAMPLE 11 |
|---|---|---|
| C-GaN LAYER 51c THICKNESS ERROR ΔW | 1.2% | 11% |
| C-GaN LAYER 51b THICKNESS ERROR ΔW | 1.8% | 11% |
| C-GaN LAYER 51a THICKNESS ERROR ΔW | 3.9% | 9% |

| SAMPLE | SAMPLE 10 | | SAMPLE 11 | |
|---|---|---|---|---|
| POSITION | CENTER | EDGE | CENTER | EDGE |
| DEFECT DENSITY (PIECES/$cm^2$) | 1.8 | 1.8 | 207 | 7.1 |

COMPOUND SEMICONDUCTOR SUBSTRATE AND COMPOUND SEMICONDUCTOR DEVICE COMPRISING A Si SUBSTRATE A SiC LAYER, NITRIDE SEMICONDUCTOR LAYERS, AN ELECTRONIC TRAVELING LAYER, AND A BARRIER LAYER

BACKGROUND OF THE INVENTION

Technological Field

The present invention relates to a compound semiconductor substrate and a compound semiconductor device. More specifically, the present invention relates to a compound semiconductor substrate and a compound semiconductor device with an electronic traveling layer and a barrier layer.

Description of the Related Art

In recent years, communication devices such as smartphones have become widely used. Along with this, there is an increasing need to improve the communication capacity and communication speed between communication devices in a mobile radio communication system. In recent mobile radio communication systems, the LTE (Long Term Evolution) service, a communication standard for mobile phones, has been implemented. Practical applications of next-generation communication standards after the LTE is also under consideration.

HEMTs (High Electron Mobility Transistors) consisting of nitride semiconductors such as GaN (gallium nitride) and AlGaN (aluminum gallium nitride) are attracting attention as a key technology in the mobile communication systems. Technologies of HEMT made of nitride semiconductors has developed rapidly in recent years.

A HEMT includes an electronic traveling layer and a barrier layer formed on the electronic traveling layer. The material forming the barrier layer has a band gap wider than the band gap of the material forming the electronic traveling layer. In a HEMT, two-dimensional electron gas is formed near the boundary face with the barrier layer in the electronic traveling layer. This two-dimensional electron gas is used for the HEMT operation. HEMTs consisting of nitride semiconductors can generate a large amount of two-dimensional electron gas and have a large current density, compared to field effect transistors consisting of GaAs (gallium arsenic) based semiconductor materials.

As an example, the lattice constant value difference between AlGaN and GaN is greater than the lattice constant value difference between AlGaAs (aluminum gallium arsenic) and GaAs. For this reason, an AlGaN layer in the AlGaN/GaN laminated structure is greatly distorted compared to an AlGaAs layer in the AlGaAs/GaAs laminated structure. Therefore, a larger piezoelectric electric field is generated in the AlGaN layer in the AlGaN/GaN laminated structure than in the AlGaAs layer in the AlGaAs/GaAs laminated structure. Due to this large piezoelectric field, more two dimensional electron gas is induced in the AlGaN/GaN laminated structure than in the AlGaAs/GaAs laminated structure. In addition, the AlGaN layer is highly spontaneously polarized, unlike the AlGaAs layer. A large amount of two dimensional electron gas is induced in the GaN layer near the boundary with the AlGaN layer by the polarization electric field caused by the spontaneous polarization of the AlGaN layer. As a result, HEMTs made of AlGaN/GaN which is nitride semiconductors can produce about 10 times more two dimensional electron gas than field effect transistors made of GaAs series AlGaAs/GaAs.

Therefore, HEMTs consisting of nitride semiconductors are expected as next-generation high-power amplifiers because they can operate at high output and high efficiency.

In order to use a HEMT consisting of nitride semiconductors as a high frequency amplifier in the above mobile communication system, it is important to suppress the loss of the high frequency signals when high frequency voltage is applied to the gate electrode of the HEMT. The main causes of this loss of the high frequency signal are the parasitic capacity and the parasitic resistance of the semiconductor device. If the parasitic capacity of the semiconductor device is large and the parasitic resistance component exists in parallel with the parasitic capacity, these parasitic elements contribute to the loss of the high frequency signals and hinder the high-speed operation of the semiconductor device.

In order to suppress the attenuation of the high frequency signals due to the above-mentioned causes, it is effective to configure the region around the two dimensional electron gas with a highly insulating material. By using a semi-insulating substrate or a high resistance substrate as a substrate of the HEMT, the parasitic elements described above can be reduced. On the other hand, when using a conductive substrate as a substrate of a HEMT, by interposing a thick semi-insulating or high resistance compound semiconductor layer between the conductive substrate and the semiconductor device components, the parasitic elements mentioned above can be reduced. From this point of view, various structures have been conventionally proposed. For example, Patent Document 1 and Non-Patent Document 1 below disclose the structure shown in FIG. 22.

FIG. 22 is a cross-sectional view schematically showing the first example of a conventional HEMT structure.

Referring to FIG. 22, the HEMT 1010 of the first example includes SiC (silicon carbide) substrate 1051 of semi-insulating, nitride buffer layer 1052, electronic traveling layer made of GaN 1053, and barrier layer made of AlGaN 1054, source electrode 1055, drain electrode 1056, and gate electrode 1057. A nitride buffer layer 1052 is formed on SiC substrate 1051 of semi-insulating. An electronic traveling layer 1053 is formed on the nitride buffer layer 1052. A barrier layer 1054 is formed on the electronic traveling layer 1053. A source electrode 1055, a drain electrode 1056 and a gate electrode 1057 are formed on the barrier layer 1054. Source electrode 1055, drain electrode 1056 and gate electrode 1057 are formed being spaced apart from each other.

In HEMT 1010, two dimensional electron gas 1053*a* is formed in electronic traveling layer 1053 near the boundary between electronic traveling layer 1053 and barrier layer 1054. Electronic traveling layer 1053, nitride buffer layer 1052, and SiC substrate 1051 are configured with highly insulating materials to configure the area around two dimensional electron gas 1053*a* with highly insulating materials. However, the semi-insulating SiC substrate have a problem that it is difficult to obtain a large size substrate. This is presumed to be due to the high difficulty of growing a semi-insulating SiC crystal. In particular, it has been difficult to obtain semi-insulating SiC substrates with a diameter greater than 4 inches. In addition, semi-insulating SiC substrates are expensive compared to other substrates.

Therefore, as a technique that does not use the semi-insulating SiC substrate, the structures shown in FIGS. 23 and 24 have been proposed. The structure shown in FIG. 23 is disclosed in Non-Patent Document 2 below. The structure shown in FIG. 24 is disclosed in Patent Document 2 and Non-Patent Document 3 below.

FIG. 23 is a cross-sectional view showing the second example of a conventional HEMT structure.

Referring to FIG. 23, HEMT 1020 as the second example differs from the structure shown in FIG. 22 in that it uses a high resistance Fz-Si (silicon) substrate 1061 instead of a semi-insulating SiC substrate as a substrate. The Fz-Si substrate is a Si substrate produced by the Fz method (Floating zone method). Also, the nitride buffer layer 1052 in the HEMT 1020 has a thickness of 1 micrometer, for example.

According to the structure shown in FIG. 23, the electronic traveling layer 1053, the nitride buffer layer 1052 and the Fz-Si substrate 1061 are made of highly insulating material so that the area around the two dimensional electron gas 1053*a* is made of highly insulating materials. In addition, the Fz-Si substrate 1061 is less expensive than the semi-insulating SiC substrate.

FIG. 24 is a cross-sectional view showing the third example of a conventional HEMT structure.

Referring to FIG. 24, HEMT 1030, which is the third example, differs from the structure shown in FIG. 22 in that n-type SiC substrate 1062 is used instead of a semi-insulating SiC substrate as a substrate, and the nitride buffer layer 1052 is thick. The n-type SiC substrate 1062 has a hexagonal crystal structure. Nitride buffer layer 1052 has a thickness of 10 micrometers or more.

According to the structure shown in FIG. 24, nitride buffer layer 1052 and electronic traveling layer 1053 are made of highly insulating materials so that the area around two dimensional electron gas 1053*a* is made of highly insulating materials. Also, the nitride buffer layer 1052 is formed with a thickness exceeding 10 micrometers. In addition, as compared to semi-insulating SiC substrates, n-type SiC substrate 1062 makes it easier to obtain large-sized substrates. In particular, 6-inch diameter n-type SiC substrate 1062 is available.

PRIOR ART DOCUMENTS

[Patent Document 1] Published Japanese translations of PCT international publication for patent applications No. 2006-517726 (JP Patent No. 4990496)

[Patent Document 2] International publication 2007/116517 (JP Patent No. 5274245)

[Non-patent document 1] S. T. Sheppard et al. "High-Power Microwave GaN/AlGaN HEMT's on Semi-Insulating Silicon Carbide Substrates", IEEE Electron Device Lett., vol. 20, No. 4, pp. 161-163, April 1999.

[Non-patent document 2] J. W. Johnson et al. "12 W/mm AlGaN—GaN HFETs on Silicon Substrates", IEEE Electron Device Lett., vol. 25, No. 7, pp. 459-461, July 2004.

[Non-patent document 3] Toshihide Kikkawa et al. "Highly Uniform AlGaN/GaN Power HEMT on a 3-inch Conductive N—SiC Substrate for Wireless Base Station Application", Technical Digest of IEEE CSIC 2005 Symposium, vol. 25, No. 7, pp. 77-80.

SUMMARY OF THE INVENTION

However, the structures shown in FIGS. 23 and 24 have the problem of poor quality.

According to the HEMT 1020 shown in FIG. 23, an insulating Fz-Si substrate 1061 is used as the substrate. The elastic limit of Fz-Si substrate 1061 is low. For this reason, during the growth of the nitride buffer layer 1052, the stress received from the nitride buffer layer 1052 due to the difference in the lattice constant values between the Fz-Si substrate 1061 and the nitride buffer layer 1052 made the substrate susceptible to plastic deformation. As a result, there was a problem that the warpage of the substrate increased to an inappropriate level in the HEMT manufacturing process. In addition, since Si has a smaller band gap than SiC, the resistance tends to be low at under high temperatures. For this reason, when the temperature of the substrate rises due to the amplification operation of the HEMT, the resistance of Si contained in the substrate is easily lowered, resulting in significant loss of high frequency signals.

The HEMT 1030 shown in FIG. 24 uses an n-type SiC substrate 1062 as the substrate. The conductivity of this n-type SiC substrate 1062 is high. For this reason, it was necessary to thicken the nitride buffer layer 1052 in order to construct the area around the two dimensional electron gas 1053*a* with a highly insulating material. When the nitride buffer layer 1052 is thickened, there are problems that cracks are likely to occur in the nitride buffer layer 1052 and the warpage of the substrate increases. In addition, from the viewpoint of manufacturing cost, the merit of replacing the semi-insulating SiC substrate with the n-type SiC substrate is offset by the demerit of forming a thick nitride buffer layer. For this reason, in terms of manufacturing cost, the HEMT 1030 shown in FIG. 24 was no better than the HEMT 1010 shown in FIG. 22.

The present invention is to solve the above problems, and the object is to provide a compound semiconductor substrate and a compound semiconductor device of high quality.

According to one aspect of the present invention, a compound semiconductor substrate comprises: a Si substrate with O concentration of $3*10^{17}/cm^3$ or more and $3*10^{18}/cm^3$ or less, a SiC layer formed on the Si substrate, a first nitride semiconductor layer made of $Al_xGa_{1-x}N$ ($0.1 \leq x \leq 1$), formed on the SiC layer and including an insulating or semi-insulating layer, a second nitride semiconductor layer formed on the first nitride semiconductor layer and including a main layer comprising of insulating or semi-insulating $Al_yGa_{1-y}N$ ($0 \leq y < 0.1$), an electronic traveling layer formed on the second nitride semiconductor layer and made of $Al_zGa_{1-z}N$ ($0 \leq z < 0.1$), and a barrier layer formed on the electronic traveling layer and having a wider band gap than a band gap of the electronic traveling layer, wherein a sum total thickness of the first and second nitride semiconductor layers and the electronic traveling layer is 6 micrometers or more and 10 micrometers or less.

Preferably, according to the compound semiconductor substrate, the second nitride semiconductor layer further includes one or more intermediate layer formed at least one of inside of the main layer and on the main layer, the intermediate layer comprising of $Al_yGa_{1-y}N$ ($0.5 \leq y \leq 1$), and the main layer has at least one of C concentration higher than that of the electronic traveling layer and Fe concentration higher than that of the electronic traveling layer.

Preferably, according to the compound semiconductor substrate, the intermediate layer is two or more layers, and each of the two or more intermediate layers has a thickness of 10 nanometers or more and 30 nanometers or less, and is formed at intervals of 0.5 micrometers or more and 10 micrometers or less.

Preferably, according to the compound semiconductor substrate, the Si substrate contains B, and has p type conductivity and a resistivity of 0.1 mΩcm or more and 100 mΩcm or less.

Preferably, according to the compound semiconductor substrate, the SiC layer has a thickness of 0.5 micrometers or more and 2 micrometers or less.

Preferably, according to the compound semiconductor substrate, Si concentration, O concentration, Mg concentration, C concentration and Fe concentration of the electronic traveling layer are all greater than 0 and less than or equal to $1*10^{17}$ atoms/$cm^3$.

Preferably, according to the compound semiconductor substrate, the first nitride semiconductor layer includes at least one of a first region made of $Al_xGa_{1-x}N$ ($0.4<x\leq1$) and a second region made of $Al_xGa_{1-x}N$ ($0.1\leq x\leq0.4$) having a thickness of 0.5 micrometer or more, the first region has Si concentration of 0 atoms/$cm^3$ or more and $5*10^{17}$ atoms/$cm^3$ or less, O concentration of 0 atoms/$cm^3$ or more and $5*10^{17}$ atoms/$cm^3$ or less, and Mg concentration of 0 atoms/$cm^3$ or more and $5*10^{17}$ atoms/$cm^3$ or less, the second region has Si concentration of 0 atoms/$cm^3$ or more and $2*10^{16}$ atoms/$cm^3$ or less, O concentration of 0 atoms/$cm^3$ or more and $2*10^{16}$ atoms/$cm^3$ or less, and Mg concentration of 0 atoms/$cm^3$ or more and $2*10^{16}$ atoms/$cm^3$ or less, at least one of C concentration and Fe concentration in the second region is higher than any of Si concentration, O concentration, and Mg concentration in the second region, and $5*10^{19}$ atoms/$cm^3$ or less, the main layer has Si concentration of 0 atoms/$cm^3$ or more and $2*10^{16}$ atoms/$cm^3$ or less, O concentration of 0 atoms/$cm^3$ or more and $2*10^{16}$ atoms/$cm^3$ or less, and Mg concentration of 0 atoms/$cm^3$ or more and $2*10^{16}$ atoms/$cm^3$ or less, at least one of C concentration and the Fe concentration in the second nitride semiconductor layer is higher than any of Si concentration, O concentration, and Mg concentration in the second nitride semiconductor layer and is $5*10^{19}$ atoms/$cm^3$ or less the main layer includes a region where concentration of activated donor ions is 0 atoms/$cm^3$ or more and $2*10^{14}$ atoms/$cm^3$ or less, and the electronic traveling layer has Si concentration of 0 atoms/$cm^3$ or more and $1*10^{16}$ atoms/$cm^3$ or less, O concentration of 0 atoms/$cm^3$ or more and $1*10^{16}$ atoms/$cm^3$ or less, and Mg concentration of 0 atoms/$cm^3$ or more and $1*10^{16}$ atoms/$cm^3$ or less, C concentration of 0 atoms/$cm^3$ or more and $1*10^{17}$ atoms/$cm^3$ or less, and Fe concentration of 0 atoms/$cm^3$ or more and $1*10^{17}$ atoms/$cm^3$ or less.

Preferably, according to the compound semiconductor substrate, the first nitride semiconductor layer includes both the first region and the second region, and a distance between the first region and the SiC layer is less than a distance between the second region and the SiC layer.

Preferably, according to the compound semiconductor substrate, the first nitride semiconductor layer has a thickness less than or equal to a thickness of the second nitride semiconductor layer.

Preferably, according to the compound semiconductor substrate, the electronic traveling layer has a thickness of 0.3 micrometers or more.

Preferably, according to the compound semiconductor substrate, stipulating a least squares plane of a top surface of the compound semiconductor substrate, when a sum total value of distance from the least squares plane to a highest point of the top surface of the compound semiconductor substrate and distance from the least squares plane to a lowest point of the top surface of the compound semiconductor substrate is defined as a warpage amount, the warpage amount is 0 or more and 50 or less micrometers.

Preferably, according to the compound semiconductor substrate, regions other than an area where a distance from an outer edge of a top surface of the compound semiconductor substrate is 5 millimeters or less do not contain cracks.

Preferably, according to the compound semiconductor substrate, the compound semiconductor substrate has a disk shape and a diameter of 100 millimeters or more and 200 millimeters or less.

Preferably, according to the compound semiconductor substrate, a top surface of the compound semiconductor substrate does not contain traces of meltback etching.

According to another aspect of the present invention, a compound semiconductor substrate comprises: a conductive SiC substrate with resistivity of 0.1 Ωcm or more and less than $1*10^5$ Ωcm, a first nitride semiconductor layer made of $Al_xGa_{1-x}N$ ($0.1\leq x\leq1$), formed on the SiC layer and including an insulating or semi-insulating layer, a second nitride semiconductor layer formed on the first nitride semiconductor layer and containing a main layer comprising of insulating or semi-insulating $Al_yGa_{1-y}N$ ($0\leq y<0.1$), an electronic traveling layer formed on the second nitride semiconductor layer and made of $Al_zGa_{1-z}N$ ($0\leq z<0.1$), and a barrier layer formed on the electronic traveling layer and having a wider band gap than a band gap of the electronic traveling layer, wherein a sum total thickness of the first and second nitride semiconductor layers and the electronic traveling layer is 6 micrometers or more and 10 micrometers or less, the second nitride semiconductor layer further includes one or more intermediate layer formed at least one of inside the main layer and on the main layer, the intermediate layer comprising of $Al_yGa_{1-y}N$ ($0.5\leq y\leq1$), and the main layer has at least one of C concentration higher than that of the electronic traveling layer and Fe concentration higher than that of the electronic traveling layer.

According to another aspect of the present invention, a compound semiconductor device comprises: the compound semiconductor substrate above mentioned, first and second electrodes formed on the barrier layer, and a third electrode which is formed on the barrier layer and controls current flowing between the first electrode and the second electrode according to applied voltage.

According to the present invention, a compound semiconductor substrate and a compound semiconductor device having high quality can be provided.

DETAILED DESCRIPTION OF EMBODIMENTS

Hereinafter, embodiments of the present invention will be described with reference to the drawings.

First Embodiment

Figure 1:
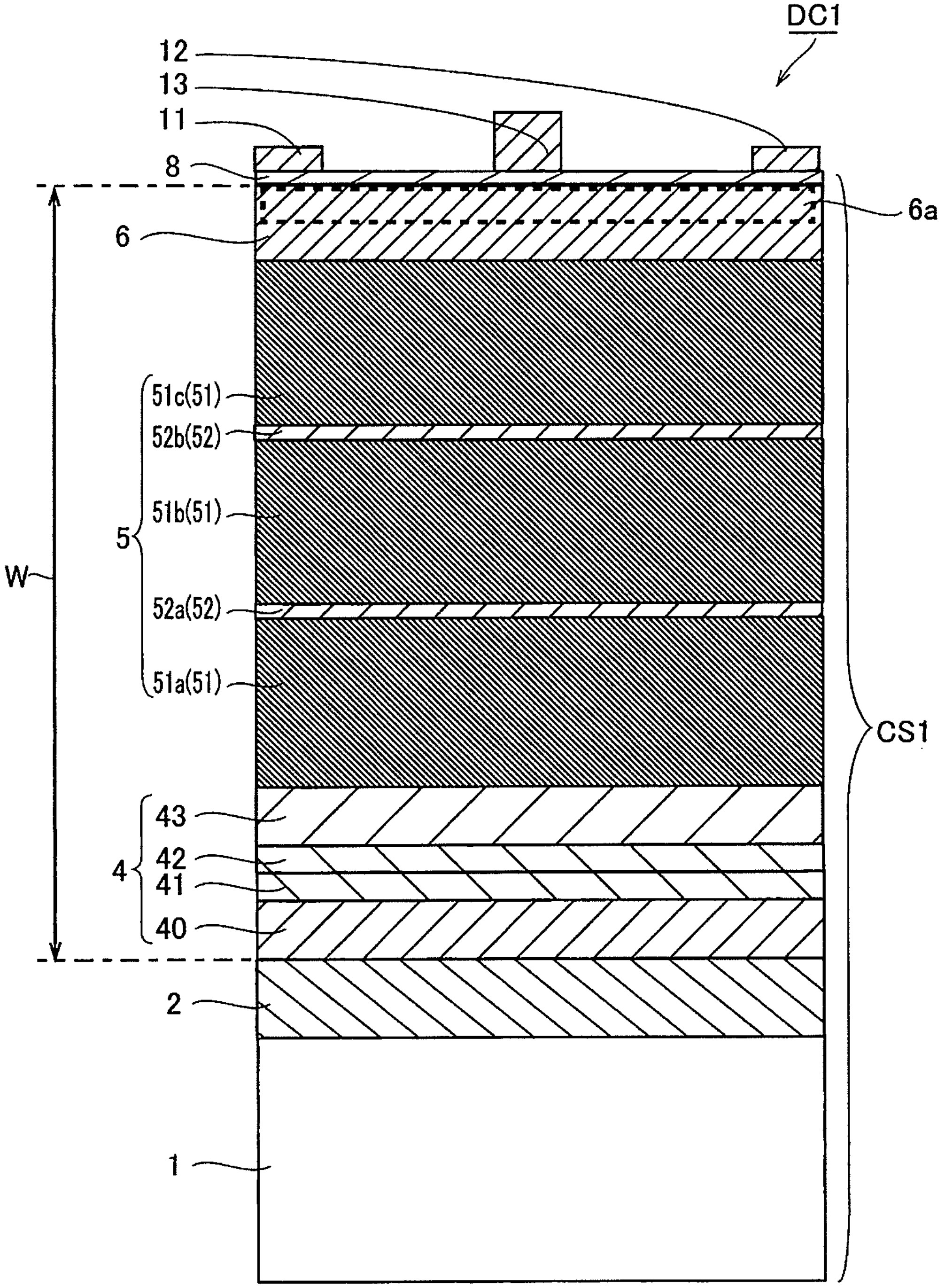
FIG. 1 is a cross-sectional view showing the configuration of compound semiconductor device DC1 and compound semiconductor substrate CS1 in the first embodiment of the present invention.

FIG. 1 is a cross-sectional view showing configurations of a compound semiconductor device DC1 and a compound semiconductor substrate CS1 in the first embodiment of the present invention.

Referring to FIG. 1, compound semiconductor device DC1 (an example of a compound semiconductor device) in the present embodiment includes a HEMT structure. The compound semiconductor device DC1 includes compound semiconductor substrate CS1 (an example of a compound semiconductor substrates), source electrode 11 (an example of a first electrode), drain electrode 12 (an example of a second electrode), and gate electrode 13 (an example of a third electrode). The source electrode 11, the drain electrode 12, and the gate electrode 13 are formed on barrier layer 8 of the compound semiconductor substrate CS1. Gate electrode 13 controls current flowing between source electrode 11 and drain electrode 12 by applied voltage.

Compound semiconductor substrate CS1 includes Si substrate 1 (an example of a Si substrate), a SiC layer 2 (an example of a SiC layer), first nitride semiconductor layer 4 (an example of a first nitride semiconductor layer), second nitride semiconductor layer 5 (an example of a second nitride semiconductor layer), electronic traveling layer 6 (an example of an electrons traveling layer), and a barrier layer 8 (an example of a barrier layer).

Si substrate 1 was produced by the Cz method (Czochralski method). According to the Cz method, a Si seed crystal is gradually pulled up from molten Si in a quartz crucible into a predetermined atmosphere such as Ar. Si adhering to the seed crystal is cooled in the atmosphere and becomes a crystal. As a result, a single-crystal of Si is obtained. According to the Cz method, when Si crystallizes, O (oxygen) contained in the quartz material forming the crucible is taken into the crystal. For this reason, Si substrate 1 has a higher O concentration than a Si substrate prepared by the Fz method. In particular, Si substrate 1 has an O concentration of $3*10^{17}$ to $3*10^{18}$ atoms/$cm^3$. Since the Si substrate 1 has a high 0 concentration, it has a higher elastic limit than a Si substrate prepared by the Fz method. A large size Si substrates 1 (e.g., 8-inch diameter) is readily available and inexpensive, compared to SiC substrates and the like.

The Si substrate 1 is made of, for example, $p^+$ type Si. Si substrate 1 may not be intentionally doped. The (111) plane is exposed on the top surface of Si substrate 1. The top surface of the Si substrate 1 has an off angle of 0 to 1 degree, preferably 0.5 degrees or less. Si substrate 1 preferably has a single-crystal diamond structure.

When the Si substrate 1 contains B (boron) and has a p type conductivity, the Si substrate 1 has a resistivity of, for example, 0.1 mΩcm or more and 100 mΩcm or less. The Si substrate 1 preferably has a resistivity of 0.5 mΩcm or more and 20 mΩcm or less, more preferably 1 mΩcm or more and 5 mΩcm or less.

Preferably, Si substrate 1 has a diameter of approximately 50 millimeters (47 millimeters to 53 millimeters as an example) and a thickness of 270 micrometers or more and 1600 micrometers or less. Si substrate 1 has a diameter of about 50.8 millimeters (47.8 to 53.8 millimeters as an example) and a thickness of 270 micrometers or more and 1600 micrometers or less. Si substrate 1 has a diameter of about 75 millimeters (72 millimeters to 78 millimeters as an example) and a thickness of 350 micrometers or more and 1600 micrometers or less. Si substrate 1 has a diameter of approximately 76.2 millimeters (73.2 millimeters to 79.2 millimeters as an example) and a thickness of 350 micrometers or more and 1600 micrometers or less. Si substrate 1 has a diameter of approximately 100 millimeters (97 millimeters to 103 millimeters as an example) and a thickness of 500 micrometers or more and 1600 micrometers or less. Si substrate 1 has a diameter of about 125 millimeters (122 to 128 millimeters as an example) and a thickness of 600 micrometers or more and 1600 micrometers or less. Si substrate 1 has a diameter of about 150 millimeters (147 to 153 millimeters as an example) and a thickness of 600 micrometers or more and 1600 micrometers or less. Alternatively, Si substrate 1 has a diameter of approximately 200 millimeters (197 millimeters to 203 millimeters as an example) and a thickness of 700 micrometers or more and 2100 micrometers or less.

More preferably, Si substrate 1 has a diameter of about 100 millimeters (99.5 to 100.5 millimeters as an example) and a thickness of 700 micrometers or more and 1100 micrometers or less. Si substrate 1 has a diameter of about 125 millimeters (124.5 to 125.5 millimeters as an example) and a thickness of 700 micrometers or more and 1100 micrometers or less. Si substrate 1 has a diameter of approximately 150 millimeters (149.8 millimeters to 150.2 millimeters as an example), and Si substrate 1 has a thickness of 900 micrometers or more and 1100 micrometers or less. Alternatively, Si substrate 1 has a diameter of approximately 200 millimeters (199.8 millimeters to 200.2 millimeters as an example) and a thickness of 900 micrometers or more and 1600 micrometers or less.

The Si substrate 1 may have an n type conductivity. The (100) plane or (110) plane may be exposed on the top surface of the Si substrate 1.

SiC layer 2 is in contact with Si substrate 1 and is formed on Si substrate 1. SiC layer 2 consists of 3C—SiC, 4H—SiC, 6H—SiC or the like. In particular, when SiC layer 2 was epitaxially grown on Si substrate 1, typically, SiC layer 2 is made of 3C—SiC.

SiC layer 2 may be formed by homoepitaxial growth of SiC with the MBE (Molecular Beam Epitaxy) method, the CVD (Chemical Vapor Deposition) method, the LPE (Liquid Phase Epitaxy) method, or the like on a foundation layer consisting of SiC obtained by carbonizing the top surface of Si substrate 1. SiC layer 2 may be formed only by carbonizing the top surface of Si substrate 1. Further, SiC layer 2 may be formed by heteroepitaxial growth on the top surface of Si substrate 1 (or interposing a buffer layer between SiC layer 2 and Si substrate 1). SiC layer 2 is doped with, for example, N (nitrogen) and has conductivity type of n type. SiC layer 2 may have p type conductivity or may be semi-insulating.

SiC layer 2 has a thickness of, for example, 0.5 micrometer or more and 2 micrometer or less. By setting the thickness of the SiC layer 2 to 0.5 micrometers or more, reaction (meltback etching) between Si in the Si substrate 1 and Ga (gallium) contained in the upper layer of the Si substrate 1 can be suppressed. Further, the state of the top surface of SiC layer 2 can be made suitable for the growth of the material that constitutes first nitride semiconductor layer 4. By setting the thickness of the SiC layer 2 to 2 micrometers or less, the occurrence of cracks into the SiC layer 2 can be suppressed, and the occurrence of warpage of the Si substrate 1 caused by the SiC layer 2 can be suppressed. SiC layer 2 preferably has a thickness of 0.7 micrometer or more and 1.5 micrometer or less. More preferably, SiC layer 2 has a thickness of 0.9 micrometer or more and 1.2 micrometer or less.

The first nitride semiconductor layer 4 is in contact with and formed on SiC layer 2. The first nitride semiconductor layer 4 is made of $Al_xGa_{1-x}N$ ($0.1 \le x \le 1$). The first nitride semiconductor layer 4 functions as a buffer layer that reduces the difference in lattice constant values between the SiC layer 2 and the second nitride semiconductor layer 5. First nitride semiconductor layer 4 has a thickness of, for example, 600 nanometers or more and 4 micrometers or less, preferably 1 micrometer or more and 3 micrometers or less, more preferably 1.5 micrometers or more and 2.5 micrometers or less. The first nitride semiconductor layer 4 is formed using the MOCVD (Metal Organic Chemical Vapor Deposition) method. At this time, as Al (aluminum) source gas, for example, TMA (Tri Methyl Aluminum), TEA (Tri Ethyl Aluminum) or the like is used. As Ga source gas, for example, TMG (Tri Methyl Gallium), TEG (Tri Ethyl Gallium), etc. are used. $NH_3$ (ammonia), for example, is used as the N source gas. First nitride semiconductor layer 4 preferably has a thickness equal to or less than a thickness of second nitride semiconductor layer 5, which will be described later.

The first nitride semiconductor layer 4 has insulating or semi-insulating properties. However, a region (lower layer) of the first nitride semiconductor layer 4 near the SiC layer 2 may have extremely low crystallinity. For this reason, the region of the first nitride semiconductor layer 4 close to the SiC layer 2 may not have insulating or semi-insulating properties locally. Even in this case, the region (upper layer) of the first nitride semiconductor layer 4 near the electronic traveling layer 6 has insulating or semi-insulating properties. The first nitride semiconductor layer 4 consists of an unintentionally doped layer (uid layer), a layer doped with C (carbon), a layer doped with transition metal, or the like.

The uid layer means a layer in which impurity is not intentionally introduced at the time of formation of the layer. The uid layer contains a small amount of impurity (impurity in the atmosphere during the layer formation) that was unintentionally introduced during formation of the layer.

As described below, first nitride semiconductor layer 4 may be composed of a plurality of layers made of different materials. The first nitride semiconductor layer 4 includes at least one of a first region made of $Al_xGa_{1-x}N$ ($0.4<x\le 1$) and a second region made of $Al_xGa_{1-x}N$ ($0.1\le x\le 0.4$) having a thickness of 0.5 micrometer or more. Preferably, first nitride semiconductor layer 4 contains both the first region and the second region, and the distance between the first region and SiC layer 2 is less than the distance between the second region and SiC layer 2.

When first nitride semiconductor layer 4 is a uid layer, the first region of first nitride semiconductor layer 4 has a Si concentration of 0 atoms/$cm^3$ or more and $5*10^{17}$ atoms/$cm^3$ or less, an O concentration of 0 atoms/$cm^3$ or more and $5*10^{17}$ atoms/$cm^3$ or less, and a Mg concentration of 0 atoms/$cm^3$ or more and $5*10^{17}$ atoms/$cm^3$ or less. The second region of first nitride semiconductor layer 4 has a Si concentration of 0 atoms/$cm^3$ to $2*10^{16}$ atoms/$cm^3$, an O concentration of 0 atoms/$cm^3$ to $2*10^{16}$ atoms/$cm^3$, and a Mg concentration of 0 atoms/$cm^3$ to $2*10^{16}$ atoms/$cm^3$. Further, at least one of C concentration and Fe concentration in the second region of first nitride semiconductor layer 4 is higher than all the Si concentration, the O concentration and the Mg concentration in the second region of first nitride semiconductor layer 4, and is $5*10^{19}$ atoms/$cm^3$ or less. This can improve the insulation of the first nitride semiconductor layer.

The second nitride semiconductor layer 5 is in contact with first nitride semiconductor layer 4 and is formed on first nitride semiconductor layer 4. Second nitride semiconductor layer 5 is formed between first nitride semiconductor layer 4 and electronic traveling layer 6. C or Fe is preferably introduced intentionally into the second nitride semiconductor layer 5. In this case, at least one of the C concentration and the Fe concentration in the second nitride semiconductor layer 5 is preferably higher than all the Si concentration, the O concentration, and the Mg concentration in the second nitride semiconductor layer 5 and is $5*10^{19}$ atoms/$cm^3$ or less. The second nitride semiconductor layer 5 includes C—GaN layer 51 (an example of a main layer) and intermediate layer 52 (an example of an intermediate layer).

The C—GaN layer 51 is a GaN layer containing C (a GaN layer into which C is intentionally introduced). C plays a role in enhancing the insulating properties of GaN. In the C—GaN layer 51, no impurities other than C are intentionally introduced during formation of the layer. In this case, the C—GaN layer 51 has a Si concentration of 0 atoms/$cm^3$ to $2*10^{16}$ atoms/$cm^3$, an O concentration of 0 atoms/$cm^3$ to $2*10^{16}$ atoms/$cm^3$, and a Mg concentration of 0 atoms/$cm^3$ to $2*10^{16}$ atoms/$cm^3$. In addition, C—GaN layer 51 includes a region in which the concentration of activated donor ions is 0 atoms/$cm^3$ or more and $2*10^{14}$ atoms/$cm^3$ or less.

The main layer constituting the second nitride semiconductor layer 5 is not limited to the C—GaN layer 51, and may be made of insulating or semi-insulating $Al_yGa_{1-y}N$ ($0 \leq y < 0.1$). The main layer forming the second nitride semiconductor layer 5 preferably has at least one of C concentration higher than the C concentration of the electronic traveling layer 6 and Fe concentration higher than the Fe concentration of the electronic traveling layer 6. On the other hand, it is preferable that the main layer constituting the second nitride semiconductor layer 5 is not intentionally introduced with impurities other than the aforementioned C and Fe during layer formation.

The intermediate layer 52 is formed inside the C—GaN layer 51 and/or on the C—GaN layer 51. The intermediate layer 52 consists of $Al_yGa_{1-y}N$ ($0.5 \leq y \leq 1$). The intermediate layer 52 is preferably made of AlN. Intermediate layer 52 should be 1 layer or more. The intermediate layer 52 is preferably two layers or less, more preferably one layer.

Second nitride semiconductor layer 5 of the present embodiment includes two intermediate layers 52*a* and 52*b*. Intermediate layers 52*a* and 52*b* are formed inside C—GaN layer 51. Intermediate layers 52*a* and 52*b* divide the C—GaN layer 51 into three C—GaN layers 51*a*, 51*b* and 51*c*. The C—GaN layer 51*a* is the lowest layer among the layers constituting the second nitride semiconductor layer 5 and is in contact with the first nitride semiconductor layer 4. Intermediate layer 52*a* is in contact with C—GaN layer 51*a* and is formed on C—GaN layer 51*a*. The C—GaN layer 51*b* is in contact with the intermediate layer 52*a* and formed on the intermediate layer 52*a*. Intermediate layer 52*b* is in contact with C—GaN layer 51*b* and is formed on C—GaN layer 51*b*. C—GaN layer 51*c* is in contact with intermediate layer 52*b* and is formed on intermediate layer 52*b*. The C—GaN layer 51*c* is the uppermost layer among the layers constituting the second nitride semiconductor layer 5 and is in contact with the electronic traveling layer 6.

In C—GaN layer 51 (in this embodiment, each of the C—GaN layers 51*a*, 51*b*, and 51*c*), the average carbon concentration in the depth direction at center PT1 (FIG. 4) is $3*10^{18}$ atoms/$cm^3$ or more and $5*10^{20}$ atoms/$cm^3$ or less, and preferably $3*10^{18}$ atoms/$cm^3$ or more and $2*10^{19}$ atoms/$cm^3$ or less. If the C—GaN layer 51 is divided into a plurality of C—GaN layers, each of the plurality of C—GaN layers may have the same average carbon concentration or different average carbon concentrations. Among the plurality of the C—GaN layers, the uppermost C—GaN layer preferably has C concentration higher than that of the electronic traveling layer 6.

If the C—GaN layer 51 is divided into multiple C—GaN layers, each of the plurality of C—GaN layers has a thickness of, for example, 550 nanometers or more and 3000 nanometers or less, preferably 800 nanometers or more and 2500 nanometers or less. Each of the plurality of C—GaN layers may have the same thickness or different thicknesses.

If there are two or more layers of intermediate layer 52 (in this embodiment, intermediate layers 52*a* and 52*b*) constituting second nitride semiconductor layer 5, each of the two or more layers of the intermediate layer may have the same thickness or may have different thicknesses. Each of the two or more intermediate layers preferably has a thickness of 10 nanometers or more and 30 nanometers or less. Each of the two or more intermediate layers is preferably formed at intervals of 0.5 micrometers or more and 10 micrometers or less.

The second nitride semiconductor layer 5 is formed using the MOCVD method. Typically, when forming a C—GaN layer, the growth temperature of the GaN layer is set lower than a growth temperature of a GaN layer in which C is not incorporated (in particular, about 300 degrees Celsius lower temperature than the growth temperature of the GaN layer which is not intentionally doped with C is set). As a result, C contained in Ga source gas is incorporated into the GaN layer, and the GaN layer becomes C—GaN layer. On the other hand, when the growth temperature of the GaN layer is lowered, the quality of the C—GaN layer is lowered, and the in-plane uniformity of the C concentration in the C—GaN layer is lowered.

Accordingly, the inventors of the present application have found a method of introducing hydrocarbon as a C source gas (C precursor) into the reaction chamber together with Ga source gas and N source gas when forming the C—GaN layer. According to this method, since incorporation of C into the GaN layer is promoted, the C—GaN layer can be formed while setting the growth temperature of GaN to a high temperature (in particular, a temperature approximately 200 degrees Celsius lower than a growth temperature of a GaN layer which is not intentionally doped with C is set). As a result, the quality of the C—GaN layer is improved, and the in-plane uniformity of the C concentration of the C—GaN layer is improved.

Specifically, hydrocarbon such as methane, ethane, propane, butane, pentane, hexane, heptane, octane, ethylene, propylene, butene, pentene, hexene, heptene, octene, acetylene, propyne, butin, pentin, hexin, heptin, or octyne is used as C source gas. In particular, hydrocarbon containing a double bond or a triple bond is preferred due to its high reactivity. As C source gas, only one type of hydrocarbon may be used, or two or more types of hydrocarbon may be used.

First nitride semiconductor layer 4 preferably has a thickness less than or equal to that of second nitride semiconductor layer 5. When the MOCVD is used to form an Al-containing nitride layer, Al organometallic gas and source gas containing ammonia are introduced over substrate. At this time, when the flow rate of source gas is large, organic metal gas of Al reacts unnecessarily with ammonia to generate particles in the gas phase. For this reason, the flow rate of source gas cannot be increased, and it takes a long time to form a nitride layer containing Al. The Al composition ratio of first nitride semiconductor layer 4 is higher than that of the main layer of second nitride semiconductor layer 5. For this reason, since the first nitride semiconductor layer 4 has a thickness equal to or less than the thickness of the second nitride semiconductor layer 5, the time required for forming the films of the first nitride semiconductor layer 4 and the second nitride semiconductor layer 5 can be shortened.

Between first nitride semiconductor layer 4 and second nitride semiconductor layer 5, another layer such as a GaN layer (uid-GaN layer), which is a uid layer, may be interposed. Second nitride semiconductor layer 5 may include layer(s) other than the intermediate layer, and the intermediate layer may be omitted.

Electronic traveling layer 6 is in contact with second nitride semiconductor layer 5 and is formed on second nitride semiconductor layer 5. Electronic traveling layer 6 consists of $Al_zGa_{1-z}N$ ($0 \le z < 0.1$). Electronic traveling layer 6 is preferably a uid layer, and preferably impurity to make it n type, p type, or semi-insulating is not intentionally introduced when forming the layer. In this case, the Si concentration, O concentration, Mg concentration, C concentration, and Fe concentration of electronic traveling layer 6 are all greater than 0 and $1*10^{17}$ atoms/$cm^3$ or less. Electronic traveling layer 6 has more preferably Si concentration of 0 atoms/$cm^3$ to $1*10^{16}$ atoms/$cm^3$, O concentration of 0 atoms/$cm^3$ to $1*10^{16}$ atoms/$cm^3$, Mg concentration of 0 atoms/$cm^3$ to $1*10^{16}$ atoms/$cm^3$, C concentration of 0 atoms/$cm^3$ to $1*10^{17}$ atoms/$cm^3$, and Fe concentration of 0 atoms/$cm^3$ to $1*10^{17}$ atoms/$cm^3$. Electronic traveling layer 6 has a thickness of, for example, 0.3 micrometer or more and 5 micrometers or less. Electronic traveling layer 6 is formed using the MOCVD method.

In particular, a region within 0.5 micrometer from the boundary with barrier layer 8 in the electronic traveling layer 6 preferably has C concentration of 0 or more and $1*10^{17}$ atoms/$cm^3$ or less. If the area within 0.5 micrometer from the boundary with barrier layer 8 in electronic traveling layer 6 has the above C concentration, a region within 3 micrometers from the boundary with the barrier layer 8 in the electronic traveling layer 6 preferably has C concentration of 0 or more and $1*10^{18}$ atoms/$cm^3$ or less. By setting the C concentration in the region near the two dimensional electron gas 6*a* within the above range, current collapse can be suppressed, and deterioration of the high frequency characteristics of the HEMT can be suppressed.

The sum total thickness W of the first nitride semiconductor layer 4, the second nitride semiconductor layer 5, and the electronic traveling layer 6 is 6 micrometers or more and 10 micrometers or less. The thickness W is preferably 7.5 micrometers or more and 8.5 micrometers or less.

The barrier layer 8 is in contact with the electronic traveling layer 6 and is formed on the electronic traveling layer 6. The barrier layer 8 is made of a nitride semiconductor with a band gap wider than the band gap of the electronic traveling layer 6. The barrier layer 8 is made of a nitride semiconductor containing Al, for example, and is made of a material represented by $Al_aGa_{1-a}N$ ($0 < a \le 1$), for example. The barrier layer 8 preferably consists of $Al_aGa_{1-a}N$ ($0.17 \le a \le 0.27$), more preferably $Al_aGa_{1-a}N$ ($0.19 \le a \le 0.22$). The barrier layer 8 has a thickness of, for example, 10 nanometers or more and 50 nanometers or less. The barrier layer 8 preferably has a thickness of, for example, 25 nanometers or more and 34 nanometers or less. When the barrier layer 8 is made of a material represented by $Al_aGa_{1-a}N$ ($0 < a \le 1$), the growth temperature for forming the barrier layer 8 is, for example, 1000 degrees Celsius or more and 1100 degrees Celsius or less. The barrier layer 8 is formed using the MOCVD method.

A spacer layer or the like may be interposed between the electronic traveling layer 6 and the barrier layer 8. A cap layer or a passivation layer may be formed on the barrier layer 8.

Figure 2:
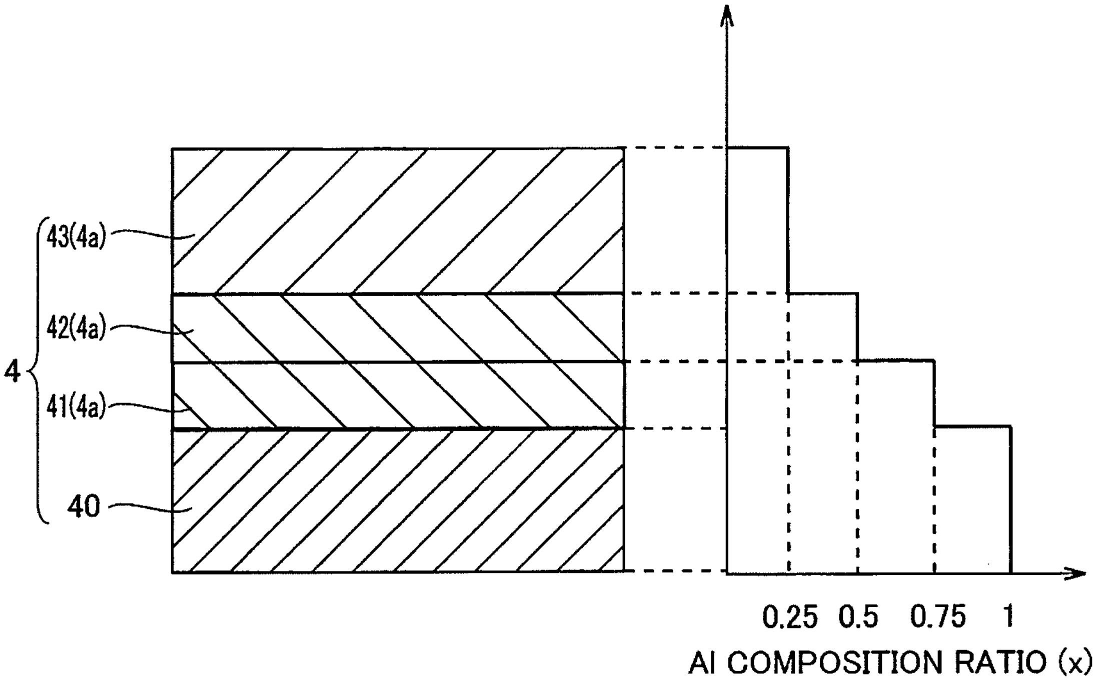
FIG. 2 is a diagram showing the distribution of the Al composition ratio inside the first nitride semiconductor layer 4 in the first embodiment of the present invention.

FIG. 2 is a diagram showing the distribution of the Al composition ratio inside the first nitride semiconductor layer 4 in the first embodiment of the present invention.

Referring to FIG. 2, the Al composition ratio inside the first nitride semiconductor layer 4 decreases from bottom to top. The first nitride semiconductor layer 4 includes an AlN layer 40 and an AlGaN layer 4*a*. AlN layer 40 is in contact with SiC layer 2 and is formed on SiC layer 2.

AlGaN layer 4*a* is in contact with AlN layer 40 and is formed on AlN layer 40. The Al composition ratio inside AlGaN layer 4*a* decreases from the bottom to the top. AlGaN layer 4*a* is composed of $Al_{0.75}Ga_{0.25}N$ layer 41 (an AlGaN layer with the Al composition ratio of 0.75), $Al_{0.5}Ga_{0.5}N$ layer 42 (an AlGaN layer with the Al composition ratio of 0.5), and $Al_{0.25}Ga_{0.75}N$ layer 43 (an AlGaN layer with the Al composition ratio of 0.25). $Al_{0.75}Ga_{0.25}N$ layer 41 is in contact with AlN layer 40 and is formed on AlN layer 40. $Al_{0.5}Ga_{0.5}N$ layer 42 is in contact with $Al_{0.75}Ga_{0.25}N$ layer 41 and is formed on $Al_{0.75}Ga_{0.25}N$ layer 41. $Al_{0.25}Ga_{0.75}N$ layer 43 is in contact with $Al_{0.5}Ga_{0.5}N$ layer 42 and is formed on $Al_{0.5}Ga_{0.5}N$ layer 42.

Each of AlN layer 40, $Al_{0.75}Ga_{0.25}N$ layer 41, and $Al_{0.5}Ga_{0.5}N$ layer 42 corresponds to a first region of first nitride semiconductor layer 4 made of $Al_xGa_{1-x}N$ ($0.4 < x \le 1$). $Al_{0.25}Ga_{0.75}N$ layer 43 corresponds to a second region of first nitride semiconductor layer 4 consisting of $Al_xGa_{1-x}N$ ($0.1 < x \le 0.4$).

The Al composition ratio inside first nitride semiconductor layer 4 is arbitrary. If first nitride semiconductor layer 4 is composed of multiple layers, the lowest layer is preferably an AlN layer.

In the present embodiment, the sum total thickness W of the first nitride semiconductor layer 4, the second nitride semiconductor layer 5, and the electronic traveling layer 6 is 6 micrometers or more and 10 micrometers or less. Since the thickness W is 6 micrometers or more, the substrate side direction viewed from the two dimensional electron gas 6*a* is thickly covered with an insulating or semi-insulating layer. As a result, high frequency loss due to the parasitic capacity and the parasitic resistance of the substrate can be suppressed, and high frequency characteristics of the HEMT can be improved. Since the thickness W is 10 micrometers or less, it is possible to suppress the occurrence of cracks and warpage of the substrate due to the increase in the sum total thickness of the first nitride semiconductor layer 4, the second nitride semiconductor layer 5, and the electronic traveling layer 6. In particular, the warpage amount of the compound semiconductor substrate CS1 can be suppressed within a range of greater than 0 and 50 micrometers or less.

Also, Si substrate 1 is produced by the Cz method. For this reason, Si substrate 1 has a high O concentration of $5*10^{17}$ to $1*10^{19}$ atoms/$cm^3$ and has a high elastic limit. By using Si substrate 1 prepared by the Cz method, warpage of the substrate caused by the first nitride semiconductor layer 4, the second nitride semiconductor layer 5, and the electronic traveling layer 6 formed with the sum total thickness W of 6 micrometers or more and 10 micrometers or less can be suppressed. By forming SiC layer 2 between Si substrate 1 and first nitride semiconductor layer 4, meltback etching caused by the reaction between Ga contained in the layer formed on the Si substrate 1 and Si in the Si substrate 1 can be suppressed. By forming SiC layer 2 between Si substrate 1 and first nitride semiconductor layer 4, the SiC layer 2 serves as a buffer layer between the Si substrate 1 and the first nitride semiconductor layer 4 and can suppress cracks from occurring into the first nitride semiconductor layer 4. As a result, a compound semiconductor substrate and a compound semiconductor device having high quality can be provided.

According to this embodiment, by forming intermediate layer 52 at least one of inside C—GaN layer 51 and on C—GaN layer 51 in second nitride semiconductor layer 5, the occurrence of warpage of Si substrate 1 can be suppressed, and the occurrence of cracks into C—GaN layer 51 or electronic traveling layer 6 on intermediate layer 52 can be suppressed. This will be described below.

When intermediate layer 52 is formed inside C—GaN layer 51, the foundation of intermediate layer 52 is C—GaN layer 51, and the layer formed on intermediate layer 52 is also C—GaN layer 51. If intermediate layer 52 is formed on C—GaN layer 51, the foundation of intermediate layer 52 is C—GaN layer 51, and the layer formed on intermediate layer 52 is electronic traveling layer 6.

$Al_yGa_{1-y}N$ ($0.5 \le y \le 1$) forming the intermediate layer 52 epitaxially grows on the C—GaN layer 51 in an unconformity state (a state in which sliding has occurred) to crystals of GaN (Generalizing, $Al_yGa_{1-y}N$ ($0 \le y < 0.1$) that constitutes the main layer) that constitutes C—GaN layer 51, which is a foundation. On the other hand, GaN constituting C—GaN layer 51 on intermediate layer 52 or $Al_zGa_{1-z}N$ ($0 \le z < 0.1$) constituting electronic traveling layer 6 is affected by crystals of $Al_yGa_{1-y}N$ ($0.5 \le y \le 1$) that constitutes intermediate layer 52 which is a foundation. That is, GaN constituting C—GaN layer 51 on intermediate layer 52 or $Al_zGa_{1-z}N$ ($0 \le z < 0.1$) constituting electronic traveling layer 6 epitaxially grows on intermediate layer 52 so as to take over the crystal structure of $Al_yGa_{1-y}N$ ($0.5 \le y \le 1$) that composes intermediate layer 52. Since lattice constant values of GaN and $Al_zGa_{1-z}N$ ($0 \le z < 0.1$) is greater than the lattice constant value of $Al_yGa_{1-y}N$ ($0.5 \le y \le 1$), the horizontal lattice constant values in FIG. 1 of GaN and $Al_zGa_{1-z}N$ ($0 \le z < 0.1$) on intermediate layer 52 is smaller than the generic (without compressive strain) lattice constant value of GaN and $Al_zGa_{1-z}N$ ($0 \le z < 0.1$). In other words, C—GaN layer 51 on intermediate layer 52 or electronic traveling layer 6 contains compressive strain inside.

When temperature drop after formation of C—GaN layer 51 and electronic traveling layer 6, due to the difference in thermal expansion coefficient between GaN and $Al_zGa_{1-z}N$ ($0 \le z < 0.1$), and Si, the C—GaN layer 51 and electronic traveling layer 6 receive stress from the intermediate layer 52, which is the foundation. This stress can cause warpage in the Si substrate 1 and cause cracks into the C—GaN layer 51 and electronic traveling layer 6. However, this stress is mitigated by compressive strain introduced inside C—GaN layer 51 on intermediate layer 52 or electronic traveling layer 6 when forming C—GaN layer 51 and electronic traveling layer 6. As a result, it can suppress the occurrence of warpage of Si substrate 1, and the occurrence of cracks into C—GaN layer 51 or electronic traveling layer 6 can be suppressed.

Compound semiconductor substrate CS1 contains C—GaN layer 51, intermediate layer 52, and first nitride semiconductor layer 4 with higher insulation breakdown voltage than GaN's insulation breakdown voltage. As a result, the vertical withstand voltage of the compound semiconductor substrate can be improved.

According to this embodiment, since compound semiconductor substrate CS1 contains first nitride semiconductor layer 4 between Si substrate 1 and electronic traveling layer 6, difference between the lattice constant value of Si and the lattice constant value of $Al_zGa_{1-z}N$ (0 z<0.1) of electronic traveling layer 6 can be relaxed. This is because the lattice constant value of $Al_xGa_{1-x}N$ ($0.1 < x \le 1$) in the first nitride semiconductor layer 4 has a value between the lattice constant value of Si and the lattice constant value of $Al_zGa_{1-z}N$ ($0 \le z < 0.1$). As a result, the crystal quality of electronic traveling layer 6 can be improved. Further, it can suppress the occurrence of warpage of Si substrate 1, and the occurrence of cracks into C—GaN layer 51 and electronic traveling layer 6 can be suppressed.

According to this embodiment, since occurrence of warpage in Si substrate 1 and occurrence of cracks into electronic traveling layer 6 can be suppressed as described above, the film of electronic traveling layer 6 can be thickened.

Further, compound semiconductor substrate CS1 contains SiC layer 2 as a foundation layer of electronic traveling layer 6. The lattice constant value of SiC is closer to the lattice constant value of $Al_zGa_{1-z}N$ ($0 \le z < 0.1$) in electronic traveling layer 6 compared to the lattice constant value of Si. Since C—GaN layer 51 and electronic traveling layer 6 are formed on SiC layer 2, the crystal quality of C—GaN layer 51 and electronic traveling layer 6 can be improved.

According to this embodiment, as described above, by separating the functions of the first nitride semiconductor layer 4, the second nitride semiconductor layer 5, and the SiC layer 2, the effect of suppressing the occurrence of warpage in Si substrate 1 and the occurrence of cracks into C—GaN layer 51 and electronic traveling layer 6 are suppressed, the effect of improving the withstand voltage of the compound semiconductor substrate CS1, and the effect of improving the crystal quality of the C—GaN layer 51 and the electronic traveling layer 6 can be increased. In particular, according to this embodiment, by using SiC layer 2 as the foundation layer, the contribution of improving the crystal quality of electronic traveling layer 6 is large.

According to this embodiment, with SiC layer 2 and improved crystal quality of C—GaN layer 51 and electronic traveling layer 6, intermediate layer 52 in second nitride semiconductor layer 5 can more effectively suppress the occurrence of warpage and cracks. Further, since C—GaN layer 51 and electronic traveling layer 6 can be thickened with SiC layer 2 and improved crystal quality of C—GaN layer 51, withstand voltage can be further improved. The performance of the HEMT can also be improved.

According to this embodiment, second nitride semiconductor layer 5 contains one or more layers of intermediate layer 52 formed inside C—GaN layer 51 and/or on C—GaN layer 51 as intermediate layer 52 consisting of $Al_yGa_{1-y}N$ ($0.5 \le y \le 1$). C—GaN layer 51 has at least one of C concentration higher than that of electronic traveling layer 6 and Fe concentration higher than that of electronic traveling layer 6. Hence, while increasing the insulation of the nitride semiconductor layer, the occurrence of warpage and cracks can be suppressed.

According to this embodiment, in a compound semiconductor substrate with a disk shape and a diameter of 100 millimeters or more and 200 millimeters or less (a compound semiconductor substrate with a large diameter), the warpage amount as defined below can be between 0 and 50 micrometers. In addition, areas other than the area where the distance from the outer edge of the top surface of the compound semiconductor substrate is 5 millimeters or less can be configured not to include cracks. Further, the top surface of the compound semiconductor substrate can be made to contain no trace of meltback etching.

When forming C—GaN layer 51, by introducing hydrocarbon as C source gas, C—GaN layer 51 can be formed while setting the GaN growth temperature to a high temperature. Since growth temperature of GaN becomes high temperature, the quality of C—GaN layer 51 is improved.

Figure 3:
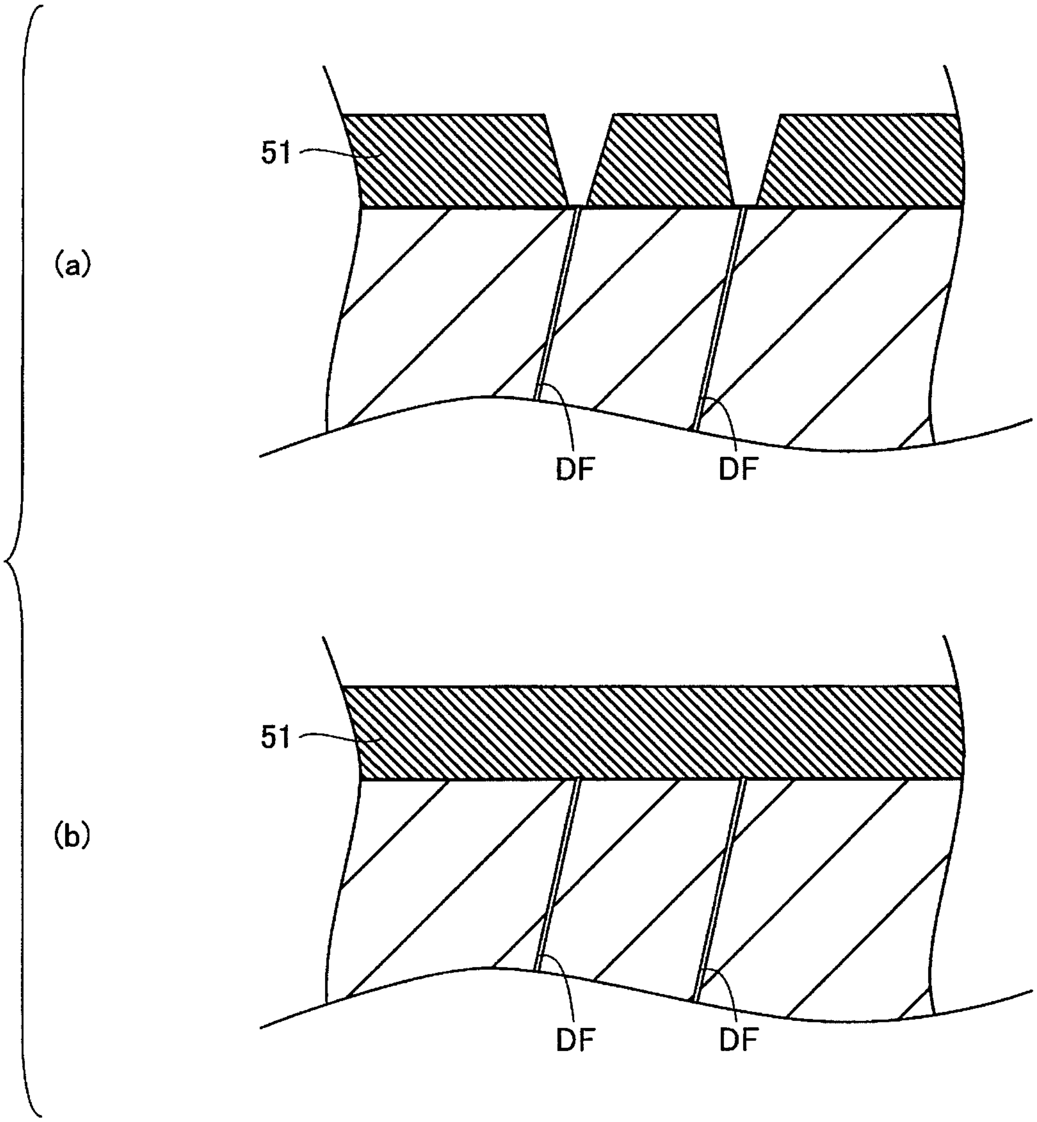
FIG. 3 is a diagram schematically showing two-dimensional growth of GaN forming the C—GaN layer 51.

FIG. 3 is a diagram schematically showing two-dimensional growth of GaN forming the C—GaN layer 51. FIG. 3(*a*) shows growth when GaN growth temperature is at low temperature, and FIG. 3(*b*) shows growth when GaN growth temperature is at high temperature.

Referring to FIG. 3(*a*), when growth temperature of GaN is low temperature, since the two-dimensional growth (horizontal direction in FIG. 3) of C—GaN layer 51 is slow, defects DF such as pits that existed in the lower layer of C—GaN layer 51 were not covered by C—GaN layer 51, and defects DF spreads easily inside C—GaN layer 51.

Referring to FIG. 3(*b*), according to this embodiment, since growth temperature of GaN becomes high temperature, the two-dimensional growth of GaN is accelerated, and the defects DF such as pits existing under the C—GaN layer 51 are covered with the C—GaN layer 51. As a result, the defect density in C—GaN layer 51 can be reduced, and situations in which defects DF penetrate the compound semiconductor substrate in the vertical direction and the voltage endurance of the compound semiconductor substrate drops significantly can be avoided.

Figure 4:
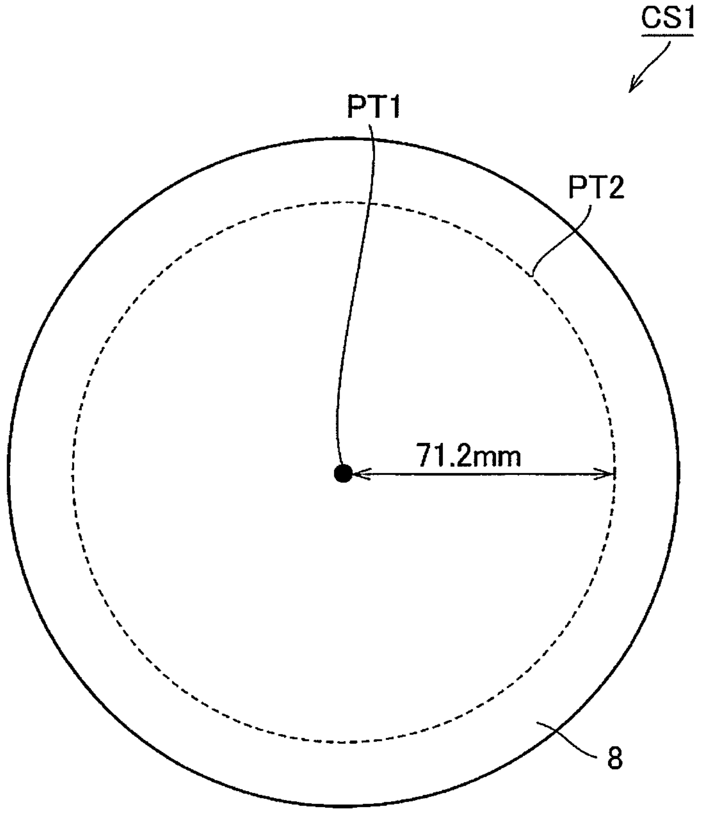
FIG. 4 is a plan view showing the configuration of compound semiconductor substrate CS1 according to the first embodiment of the present invention.

FIG. 4 is a plan view showing the configuration of compound semiconductor substrate CS1 according to the first embodiment of the present invention.

With reference to FIG. 4, the planar shape of compound semiconductor substrate CS1 is optional. If the compound semiconductor substrate CS1 has a circular planar shape, the diameter of the compound semiconductor substrate CS1 is 6 inches or more. When viewed in a plane, the center of compound semiconductor substrate CS1 is center PT1, and the position 71.2 millimeters away from center PT1 (corresponding to a position 5 millimeters away from the outer peripheral edge of the substrate with a diameter of 6 inches) is edge PT2.

As a result of the improved quality of C—GaN layer 51, the in-plane uniformity of the film thickness of the C—GaN layer 51 is improved, and the in-plane uniformity of the C concentration of the C—GaN layer 51 is improved. The vertical intrinsic breakdown voltage value of compound semiconductor substrate CS1 is improved, and the defect density of the C—GaN layer 51 is reduced. As a result, the in-plane uniformity of current-voltage characteristics in the vertical direction can be improved.

In particular, when the carbon concentration of the center position in the depth direction (the vertical direction in FIG. 1) at center PT1 of C—GaN layer 51 is the density C1 and the carbon density of the center position in the depth direction at edge PT2 of C—GaN layer 51 is the density C2, concentration error ΔC represented by $\Delta C\ (\%) = |C1 - C2| * 100/C1$ is 0 or more and 50% or less, preferably 0 or more and 33% or less.

When the film thickness at center PT1 of C—GaN layer 51 is the film thickness W1 and the film thickness at edge PT2 of C—GaN layer 51 is the film thickness W2, film thickness error ΔW expressed as $\Delta W\ (\%) = |W1 - W2| * 100/W1$ is greater than 0 and less than or equal to 8%, preferably greater than 0 and less than or equal to 4%.

The vertical intrinsic breakdown voltage value of compound semiconductor substrate CS1 is 1200V or more and 1600V or less. The defect density at center PT1 of C—GaN layer 51 causing dielectric breakdown at a voltage value equal to or less than 80% of this intrinsic breakdown voltage value is greater than 0 and less than or equal to 100 pieces/$cm^2$, preferably greater than 0 and 2 pieces/$cm^2$ or less. The defect density at edge PT2 of C—GaN layer 51 causing dielectric breakdown at a voltage value equal to or less than 80% of this intrinsic breakdown voltage value is greater than 0 and no greater than 7 pieces/$cm^2$, preferably greater than 0 and no greater than 2 pieces/$cm^2$.

Second Embodiment

Figure 5:
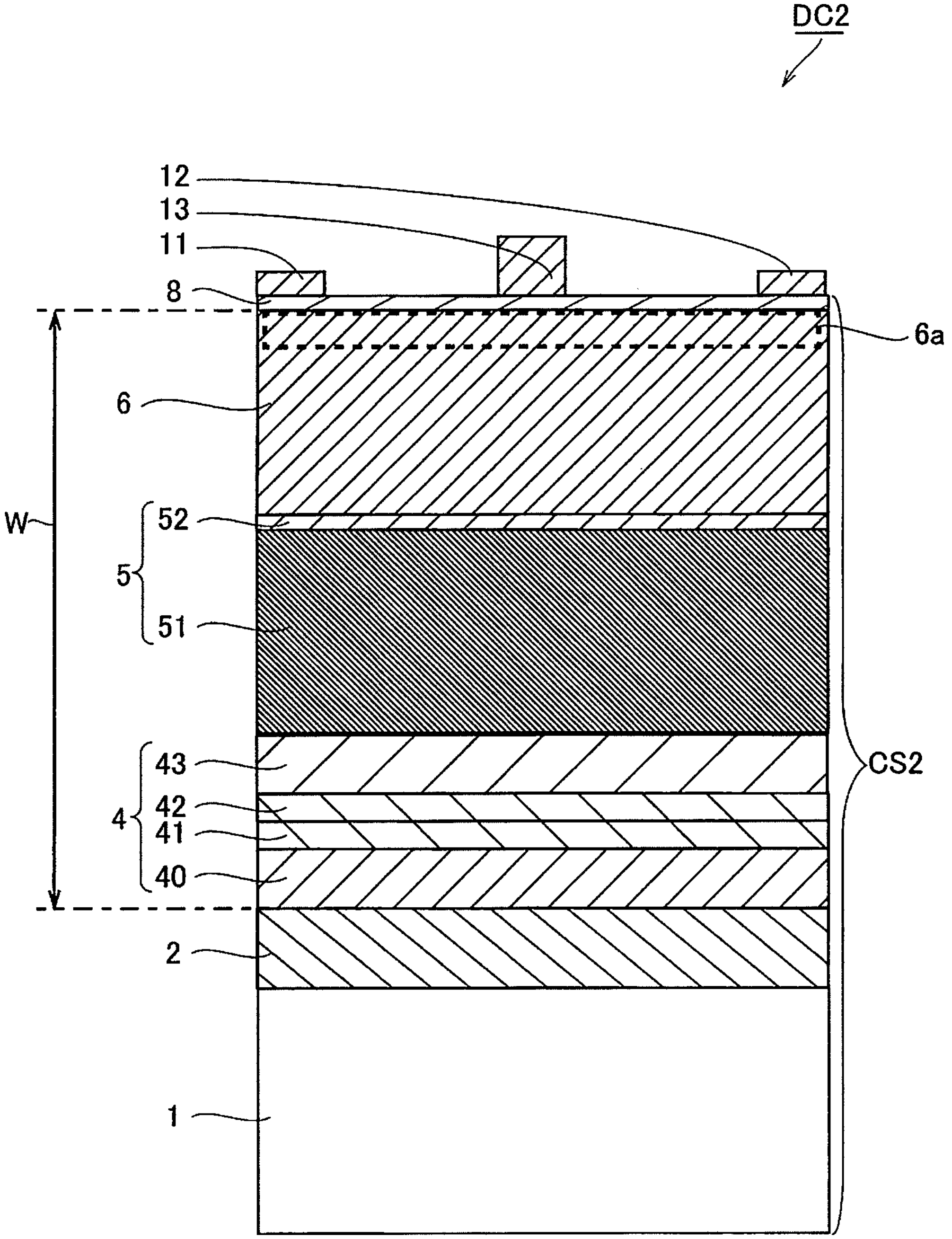
FIG. 5 is a cross-sectional view showing the configuration of compound semiconductor device DC2 and compound semiconductor substrate CS2 according to the second embodiment of the present invention.

FIG. 5 is a cross-sectional view showing the configuration of compound semiconductor device DC2 and compound semiconductor substrate CS2 according to the second embodiment of the present invention.

Referring to FIG. 5, compound semiconductor device DC2 (an example of a compound semiconductor device) in the present embodiment has compound semiconductor substrate CS2 (an example of a compound semiconductor substrates) instead of compound semiconductor substrate CS1. Compound semiconductor substrate CS2 has a different internal configuration of second nitride semiconductor layer 5 compared to compound semiconductor substrate CS1. In particular, second nitride semiconductor layer 5 in this embodiment contains only one layer of intermediate layer 52. Intermediate layer 52 is formed on C—GaN layer 51. Intermediate layer 52 is the uppermost layer among the layers constituting second nitride semiconductor layer 5 and is in contact with electronic traveling layer 6. The thickness of electronic traveling layer 6 is made thicker than the thickness of the electronic traveling layer in the first embodiment in order to compensate for the reduction in thickness W due to the reduction in the number of layers constituting second nitride semiconductor layer 5.

Since the configurations of compound semiconductor device DC2 and compound semiconductor substrate CS2 other than those described above are the same as the configurations of compound semiconductor device DC1 and compound semiconductor substrate CS1 in the first embodiment, the same members are given the same numerals, the description will not be repeated.

According to this embodiment, effects similar to those of the first embodiment can be obtained. In addition, since the number of layers constituting second nitride semiconductor layer 5 is reduced, a compound semiconductor substrate and a compound semiconductor device has a simpler structure.

[Modifications on the First and Second Embodiments]

In this modification, the configuration of modification in first nitride semiconductor layer 4 in each of compound semiconductor substrates CS1 and CS2 is explained.

Figure 6:
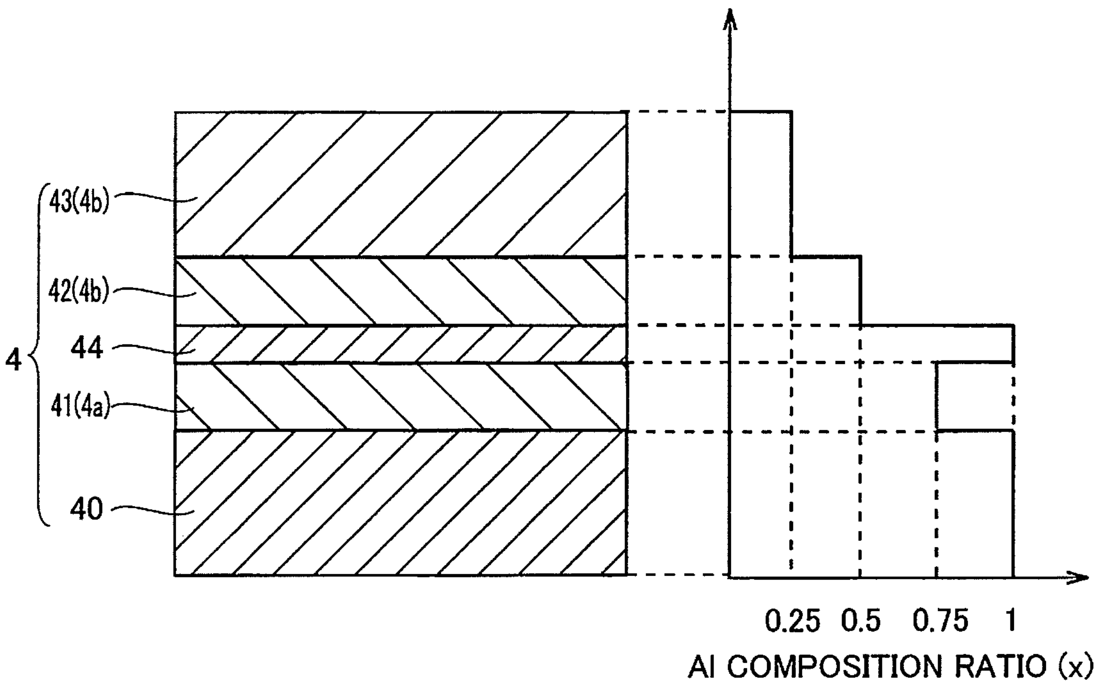
FIG. 6 is a diagram showing distribution of the Al composition ratio inside first nitride semiconductor layer 4 in the first modification of the first and second embodiments of the present invention.

FIG. 6 is a diagram showing distribution of the Al composition ratio inside first nitride semiconductor layer 4 in the first modification of the first and second embodiments of the present invention.

Referring to FIG. 6, first nitride semiconductor layer 4 in this modification includes AlN layer 40, AlGaN layer 4*a*, AlN layer 44 and AlGaN layer 4*b*. AlN layer 40 is in contact with SiC layer 2 and is formed on SiC layer 2.

AlGaN layer 4*a* is in contact with AlN layer 40 and is formed on AlN layer 40. AlGaN layer 4*a* consists of $Al_{0.75}Ga_{0.25}N$ layer 41 (an AlGaN layer with the Al composition ratio of 0.75). Al composition ratio inside AlGaN layer 4*a* is constant.

AlN layer 44 is in contact with and formed on AlGaN layer 4*a*. AlGaN layer 4*b* is in contact with and formed on AlN layer 44. Al composition ratio inside AlGaN layer 4*b* decreases from the bottom to the top. AlGaN layer 4*b* is composed of $Al_{0.5}Ga_{0.5}N$ layer 42 (AlGaN layer with an Al composition ratio of 0.5) and $Al_{0.25}Ga_{0.75}N$ layer 43 (AlGaN layer with an Al composition ratio of 0.25). $Al_{0.5}Ga_{0.5}N$ layer 42 is in contact with and formed on AlN layer 44. $Al_{0.25}Ga_{0.75}N$ layer 43 is in contact with $Al_{0.5}Ga_{0.5}N$ layer 42 and is formed on $Al_{0.5}Ga_{0.5}N$ layer 42.

Each of AlN layers 40 and 44, $Al_{0.75}Ga_{0.25}N$ layer 41, and $Al_{0.5}Ga_{0.5}N$ layer 42 corresponds to a first region in first nitride semiconductor layer 4 consisting of $Al_xGa_{1-x}N$ ($0.4<x\leq 1$). $Al_{0.25}Ga_{0.75}N$ layer 43 corresponds to a second region in first nitride semiconductor layer 4 consisting of $Al_xGa_{1-x}N$ ($0.1\leq x\leq 0.4$).

Figure 7:
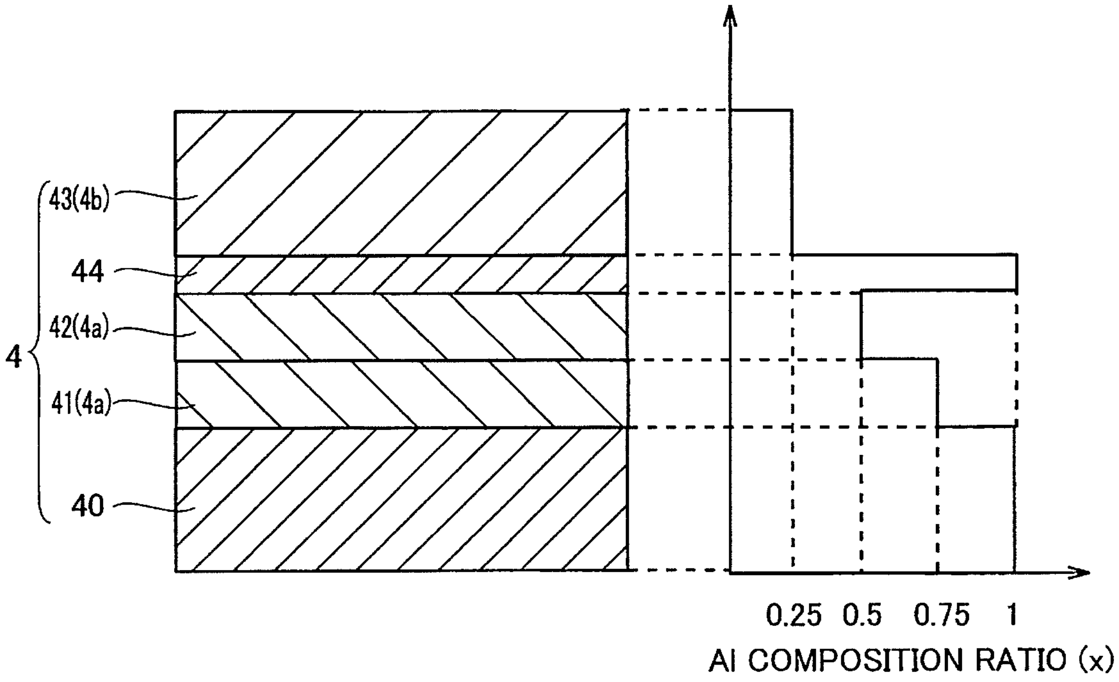
FIG. 7 is a diagram showing distribution of the Al composition ratio inside first nitride semiconductor layer 4 in the second modification of the first and second embodiments of the present invention.

FIG. 7 is a diagram showing distribution of the Al composition ratio inside first nitride semiconductor layer 4 in the second modification of the first and second embodiments of the present invention.

Referring to FIG. 7, first nitride semiconductor layer 4 in this modification includes AlN layer 40, AlGaN layer 4*a*, AlN layer 44 and AlGaN layer 4*b*. AlN layer 40 is in contact with SiC layer 2 and is formed on SiC layer 2.

AlGaN layer 4*a* is in contact with AlN layer 40 and is formed on AlN layer 40. The Al composition ratio inside AlGaN layer 4*a* decreases from the bottom to the top. AlGaN layer 4*a* is composed of $Al_{0.75}Ga_{0.25}N$ layer 41 (AlGaN layer with the Al composition ratio of 0.75) and $Al_{0.5}Ga_{0.5}N$ layer 42 (AlGaN layer with an Al composition ratio of 0.5). $Al_{0.75}Ga_{0.25}N$ layer 41 is in contact with AlN layer 40 and is formed on AlN layer 40. $Al_{0.5}Ga_{0.5}N$ layer 42 is in contact with $Al_{0.75}Ga_{0.25}N$ layer 41 and is formed on $Al_{0.75}Ga_{0.25}N$ layer 41.

AlN layer 44 is in contact with and formed on AlGaN layer 4*a*. AlGaN layer 4*b* is in contact with and formed on AlN layer 44. AlGaN layer 4*b* consists of $Al_{0.25}Ga_{0.75}N$ layer 43 (AlGaN layer with an Al composition ratio of 0.25). Al composition ratio inside AlGaN layer 4*b* is constant.

Each of AlN layers 40 and 44, $Al_{0.75}Ga_{0.25}N$ layer 41, and $Al_{0.5}Ga_{0.5}N$ layer 42 corresponds to the first region in first nitride semiconductor layer 4 consisting of $Al_xGa_{1-x}N$ ($0.4<x\leq 1$). $Al_{0.25}Ga_{0.75}N$ layer 43 corresponds to the second region of first nitride semiconductor layer 4 consisting of $Al_xGa_{1-x}N$ ($0.1\leq x\leq 0.4$).

Since the configurations other than the above in each of compound semiconductor substrate of the first and second modifications is the same as the configuration in the above-described embodiment, the same members are given the same numerals, the description will not be repeated.

AlN layer 44 serves the function of giving rise to compressive strain to AlGaN layer 4*b*. By providing AlN layer 44 like the first and second modifications, warpage and cracks can be further suppressed.

Third Embodiment

Figure 8:
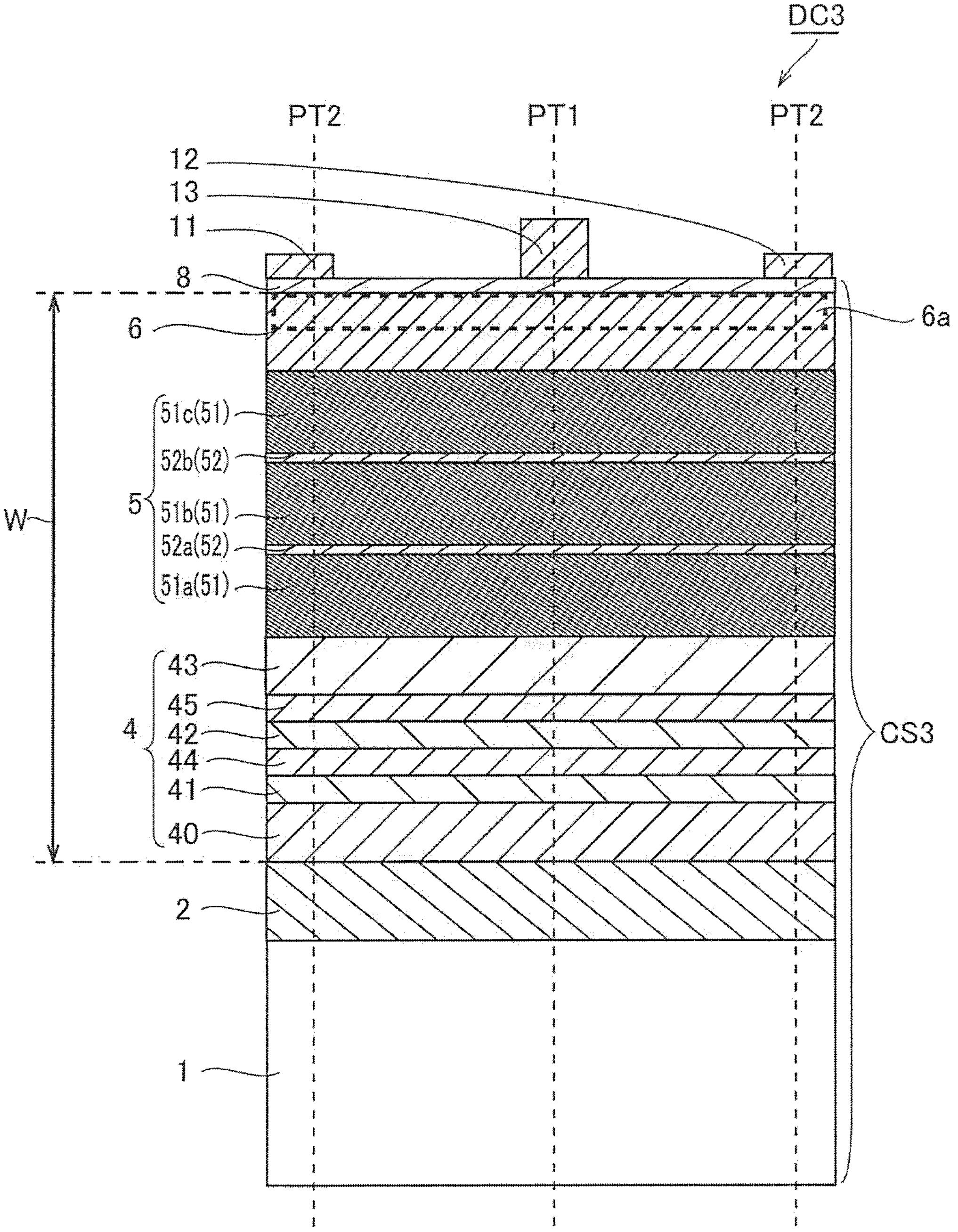
FIG. 8 is a cross-sectional view showing the configuration of compound semiconductor device DC3 and compound semiconductor substrate CS3 in the third embodiment of the present invention.

FIG. 8 is a cross-sectional view showing the configuration of compound semiconductor device DC3 and compound semiconductor substrate CS3 in the third embodiment of the present invention.

Referring to FIG. 8, compound semiconductor device DC3 (an example of a compound semiconductor device) in the present embodiment has compound semiconductor substrate CS3 (an example of a compound semiconductor substrates) instead of compound semiconductor substrate CS1. In compound semiconductor substrate CS3, first nitride semiconductor layer 4 includes AlN layer 40, $Al_{0.75}Ga_{0.25}N$ layer 41, AlN layer 44, $Al_{0.5}Ga_{0.5}N$ layer 42, AlN layer 45, and $Al_{0.25}Ga_{0.75}N$ layer 43. AlN layer 40 is in contact with SiC layer 2 and formed on SiC layer 2. $Al_{0.75}Ga_{0.25}N$ layer 41 is in contact with AlN layer 40 and is formed on AlN layer 40. AlN layer 44 is in contact with and formed on $Al_{0.75}Ga_{0.25}N$ layer 41. $Al_{0.5}Ga_{0.5}N$ layer 42 is in contact with and formed on AlN layer 44. AlN layer 45 is in contact with and formed on $Al_{0.5}Ga_{0.5}N$ layer 42. $Al_{0.25}Ga_{0.75}N$ layer 43 is in contact with and formed on AlN layer 45.

Each of AlN layers 40, 44, and 45, $Al_{0.75}Ga_{0.25}N$ layer 41 and $Al_{0.5}Ga_{0.5}N$ layer 42 corresponds to the first region in first nitride semiconductor layer 4 consisting of $Al_xGa_{1-x}N$ ($0.4<x\leq 1$). $Al_{0.25}Ga_{0.75}N$ layer 43 corresponds to the second region of first nitride semiconductor layer 4 consisting of $Al_xGa_{1-x}N$ ($0.1\leq x\leq 0.4$).

Since the configurations of compound semiconductor device DC3 and compound semiconductor substrate CS3 other than those described above are the same as the configurations of compound semiconductor device DC1 and compound semiconductor substrate CS1 in the first embodiment, the same members are given the same numerals, the description will not be repeated.

According to this embodiment, effects similar to those of the first embodiment can be obtained.

Fourth Embodiment

Figure 9:
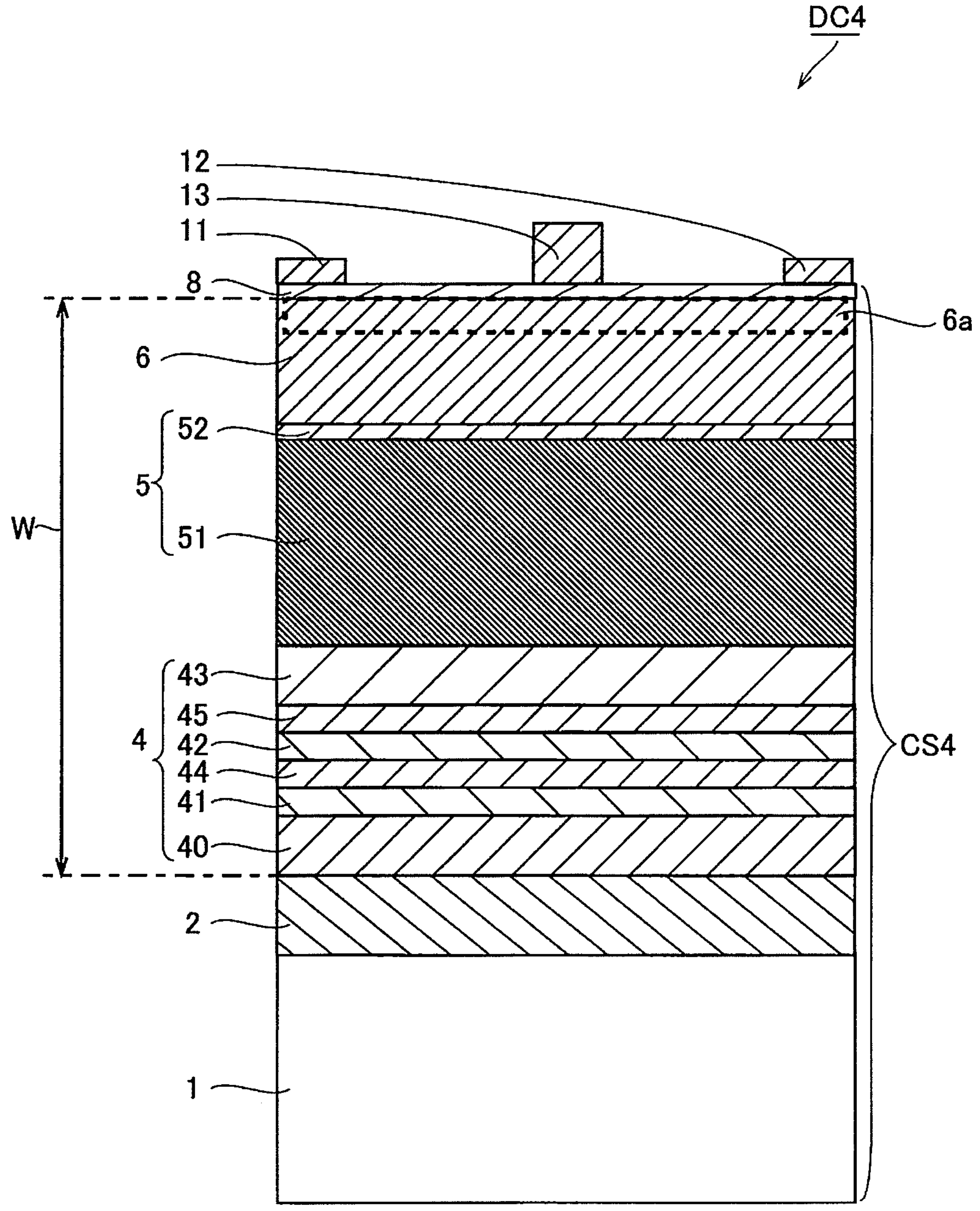
FIG. 9 is a cross-sectional view showing the configuration of compound semiconductor device DC4 and compound semiconductor substrate CS4 in the fourth embodiment of the present invention.

FIG. 9 is a cross-sectional view showing the configuration of compound semiconductor device DC4 and compound semiconductor substrate CS4 in the fourth embodiment of the present invention.

Referring to FIG. 9, compound semiconductor device DC4 (an example of a compound semiconductor device) in the present embodiment has compound semiconductor substrate CS4 (an example of a compound semiconductor substrates) instead of compound semiconductor substrate CS1. In compound semiconductor substrate CS4, first nitride semiconductor layer 4 has the same structure as the first nitride semiconductor layer in compound semiconductor substrate CS3 in the third embodiment. In particular, first nitride semiconductor layer 4 includes AlN layer 40, $Al_{0.75}Ga_{0.25}N$ layer 41, AlN layer 44, $Al_{0.5}Ga_{0.5}N$ layer 42, AlN layer 45, and $Al_{0.25}Ga_{0.75}N$ layer 43. AlN layer 40 is in contact with SiC layer 2 and formed on SiC layer 2. $Al_{0.75}Ga_{0.25}N$ layer 41 is in contact with AlN layer 40 and is formed on AlN layer 40. AlN layer 44 is in contact with and formed on $Al_{0.75}Ga_{0.25}N$ layer 41. $Al_{0.5}Ga_{0.5}N$ layer 42 is in contact with and formed on AlN layer 44. AlN layer 45 is in contact with and formed on $Al_{0.5}Ga_{0.5}N$ layer 42. $Al_{0.25}Ga_{0.75}N$ layer 43 is in contact with and formed on AlN layer 45.

Each of AlN layers 40, 44, and 45, $Al_{0.75}Ga_{0.25}N$ layer 41 and $Al_{0.5}Ga_{0.5}N$ layer 42 corresponds to the first region in first nitride semiconductor layer 4 consisting of $Al_xGa_{1-x}N$ ($0.4<x\leq 1$). $Al_{0.25}Ga_{0.75}N$ layer 43 corresponds to the second region of first nitride semiconductor layer 4 consisting of $Al_xGa_{1-x}N$ ($0.1\leq x\leq 0.4$).

In compound semiconductor substrate CS4, second nitride semiconductor layer 5 has the same structure as the second nitride semiconductor layer in compound semiconductor substrate CS2 in the second embodiment. In particular, second nitride semiconductor layer 5 contains only one layer of intermediate layer 52. Intermediate layer 52 is formed on C—GaN layer 51. Intermediate layer 52 is the uppermost layer among the layers constituting second nitride semiconductor layer 5 and is in contact with electronic traveling layer 6.

Since the configurations of compound semiconductor device DC4 and compound semiconductor substrate CS4 other than those described above are the same as the configurations of compound semiconductor device DC1 and compound semiconductor substrate CS1 in the first embodiment, the same members are given the same numerals, the description will not be repeated.

According to this embodiment, effects similar to those of the first embodiment can be obtained.

EXAMPLES

As the first examples, the inventors of the present application have produced each of samples 1 to 3 having the configurations described below as samples.

Sample 1 (an example of the present invention): Using a 6-inch Si substrate made by the Cz method, a structure similar to compound semiconductor substrate CS3 shown in FIG. 8 was fabricated. The sum total thickness W of first nitride semiconductor layer 4, second nitride semiconductor layer 5, and electronic traveling layer 6 was set to 7 micrometers.

Sample 2 (an example of the present invention): Using a 6-inch Si substrate made by the Cz method, a structure similar to compound semiconductor substrate CS3 shown in FIG. 8 was fabricated. The sum total thickness W of first nitride semiconductor layer 4, second nitride semiconductor layer 5, and electronic traveling layer 6 was set to 8 micrometers.

Sample 3 (an example of the present invention): Using a 6-inch Si substrate made by the Cz method, a structure similar to compound semiconductor substrate CS4 shown in FIG. 9 was fabricated. The sum total thickness W of first nitride semiconductor layer 4, second nitride semiconductor layer 5, and electronic traveling layer 6 was set to 8 micrometers.

Sample 4 (a comparative example): Except for using a 6 inch Si substrate made by the Fz method, a structure similar to compound semiconductor substrate CS3 shown in FIG. 8 was fabricated. The sum total thickness W of first nitride semiconductor layer 4, second nitride semiconductor layer 5, and electronic traveling layer 6 was set to 7 micrometers.

Sample 5 (a comparative example): Except for using a 6 inch Si substrate made by the Fz method, a structure similar to compound semiconductor substrate CS3 shown in FIG. 8 was fabricated. The sum total thickness W of first nitride semiconductor layer 4, second nitride semiconductor layer 5, and electronic traveling layer 6 was set to 8 micrometers.

Sample 6 (a comparative example): Except for using a 6 inch Si substrate made by the Fz method, a structure similar to compound semiconductor substrate CS4 shown in FIG. 9 was fabricated. The sum total thickness W of first nitride semiconductor layer 4, second nitride semiconductor layer 5, and electronic traveling layer 6 was set to 8 micrometers.

Sample 7 (a comparative example): Except for omitting the SiC layer 2, a structure similar to compound semiconductor substrate CS3 shown in FIG. 8 was fabricated. This comparative example uses a 6 inch Si substrate made by the Cz method. The sum total thickness W of first nitride semiconductor layer 4, second nitride semiconductor layer 5, and electronic traveling layer 6 was set to 7 micrometers.

Sample 8 (a comparative example): Except for omitting the SiC layer 2, a structure similar to compound semiconductor substrate CS3 shown in FIG. 8 was fabricated. This comparative example uses a 6 inch Si substrate made by the Cz method. The sum total thickness W of first nitride semiconductor layer 4, second nitride semiconductor layer 5, and electronic traveling layer 6 was set to 8 micrometers.

Sample 9 (a comparative example): Except for omitting the SiC layer 2, a structure similar to compound semiconductor substrate CS4 shown in FIG. 9 was fabricated. This comparative example uses a 6 inch Si substrate made by the Cz method. The sum total thickness W of first nitride semiconductor layer 4, second nitride semiconductor layer 5, and electronic traveling layer 6 was set to 8 micrometers.

For the surface measurement, the inventors of the present application performed the CV measurement for each of the obtained samples 1 to 3 using a surface two-probe type mercury probe. Then, the depth direction distribution of donor ion concentrations in each of samples 1 to 3 was obtained from the obtained CV data. For this CV measurement, "CV92M Manual Mercury Prober (registered trademark)" manufactured by "Four Dimensions (registered trademark)" and "E4980A LCR meter (registered trademark) manufactured by "Keysight Technologies (registered trademark)" were used. As a result, sufficiently high resistance or semi-insulating region with donor ion concentration of $2*10^{14}$ atoms/$cm^3$ or less was confirmed within C—GaN layer 51 (main layer) in any of samples 1 to 3.

The inventors of the present application measured the warpage amount for each of the obtained samples 1-6. For the measurement of the warpage amount, a flatness measuring machine called "Flatmaster" manufactured by "Corning Tropel (registered trademark)" was used. The warpage amount was calculated according to the standard called SORI. In particular, the least squares plane of the top surface of the sample was calculated (prescribed). Then, the sum total of the absolute value of distance to the highest point of the top surface of the sample from the least squares plane calculated and the absolute value of distance to the lowest point of the top surface of the sample from the least squares plane calculated was calculated as the warpage amount.

Figure 10:
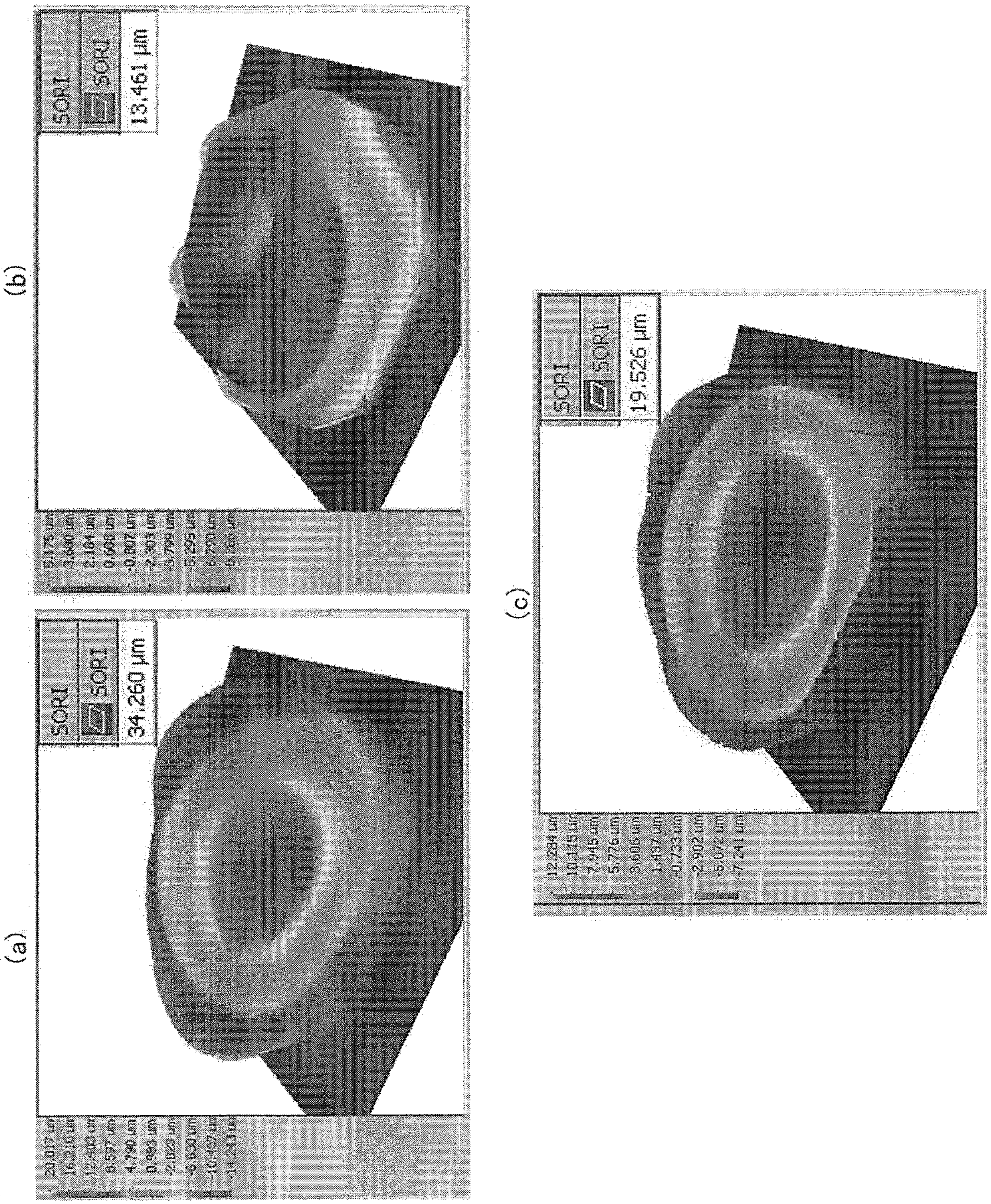
FIG. 10 is a diagram showing the distribution of the warpage amount of each top surface of samples 1 to 3 in the first example of the present invention.

FIG. 10 is a diagram showing the distribution of the warpage amount of each top surface of samples 1 to 3 in the first example of the present invention. FIG. 10(*a*) is a diagram showing the distribution of the warpage amount of the top surface of sample 1. FIG. 10(*b*) is a diagram showing the distribution of the warpage amount of the top surface of sample 2. FIG. 10(*c*) is a diagram showing the distribution of the warpage amount of the top surface of sample 3.

Referring to FIG. 10, the warpage amount of sample 1 was 34.260 micrometers. The warpage amount of sample 2 was 13.461 micrometers. The warpage amount of sample 3 was 19.526 micrometers. The inventors of the present application produced a plurality of sample as sample 1, and calculated the warpage amount for each of the obtained plurality of sample 1. The inventors of the present application produced a plurality of sample as sample 2, and calculated the warpage amount for each of the obtained plurality of sample 2. Further, the inventors of the present application produced a plurality of sample as sample 3, and calculated the warpage amount for each of the obtained plurality of sample 3. As a result, the warpage amounts of samples 1 to 3 were all 0 or more and 50 or less micrometers. On the other hand, the warpage amount of samples 4 to 6 all exceeded 50 micrometers. From this result, it can be seen that the warpage amount is suppressed more in samples 1-3 than in samples 4-6.

Next, the inventors of the present application confirmed the occurrence of cracks and the occurrence of meltback etching for each of the obtained samples 1-3 and 7-9. A laser beam was irradiated to the top surface of the samples, and a laser scattering image was created based on the received scattered light. The presence or absence of occurrence of cracks and the occurrence of meltback etching were confirmed from the created laser scattering image. "CANDELA (registered trademark)" manufactured by "KLA-TENCOR (registered trademark)" was used to create the laser scattering image.

Figure 11:
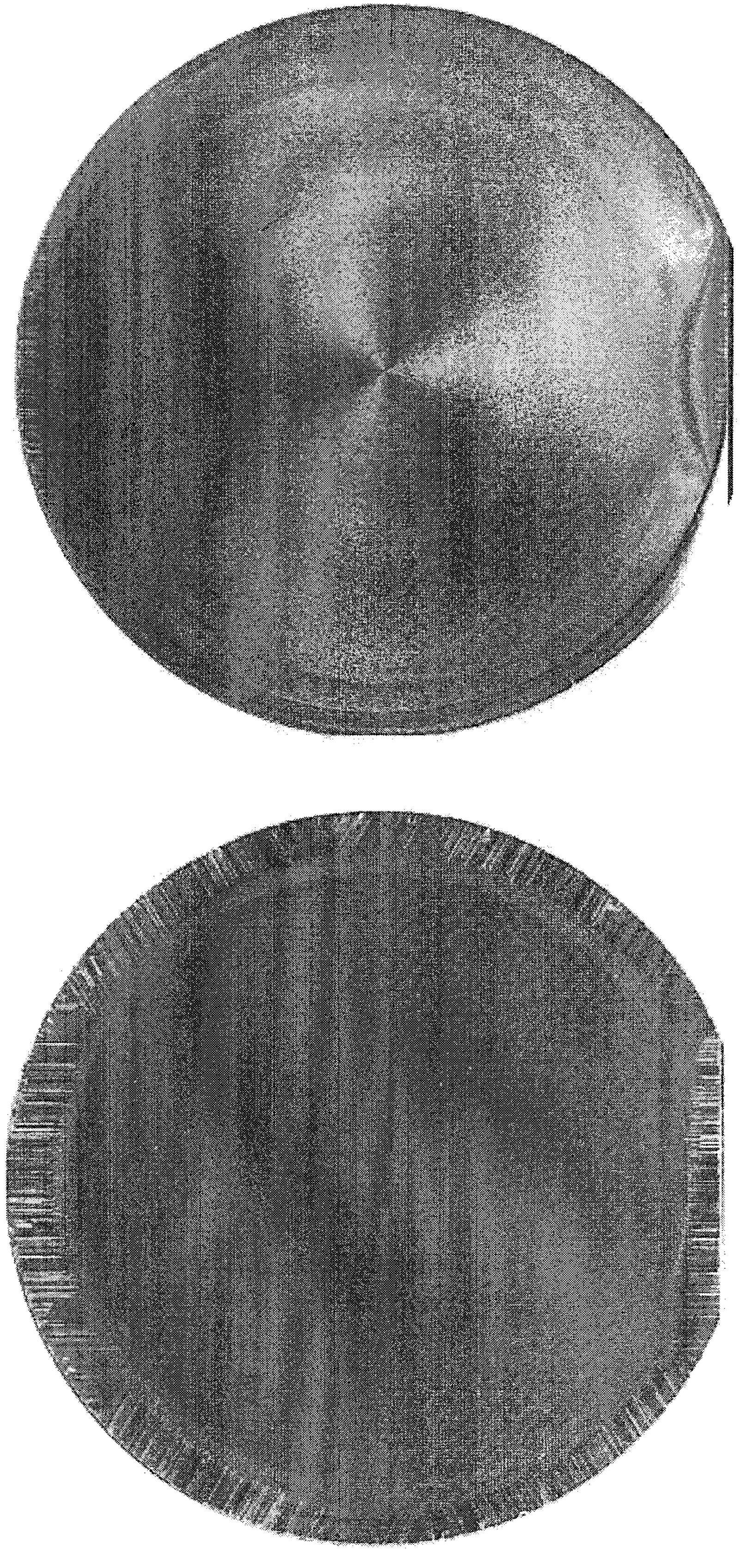
FIG. 11 is a laser scattering image of the top surface of each of samples 1 and 7 in the first example of the present invention.

FIG. 11 is a laser scattering image of the top surface of each of samples 1 and 7 in the first example of the present invention. FIG. 10(*a*) is a laser scattering image of the top surface of sample 1. FIG. 10(*b*) is a laser scattering image of the top surface of sample 7.

Referring to FIG. 11, each thickness W of samples 1 and 7 is 7 micrometers. A slight occurrence of cracks was observed in the area near the peripheral end (an area where the distance from the peripheral end is 5 millimeters or less) of the top surface in sample 1. No occurrence of cracks was observed in other areas. No trace of meltback etching was found on the top surface of sample 1. On the other hand, in the area near the peripheral end of the top surface of sample 7, huge cracks having a length of 10 millimeters or more were observed.

Figure 12:
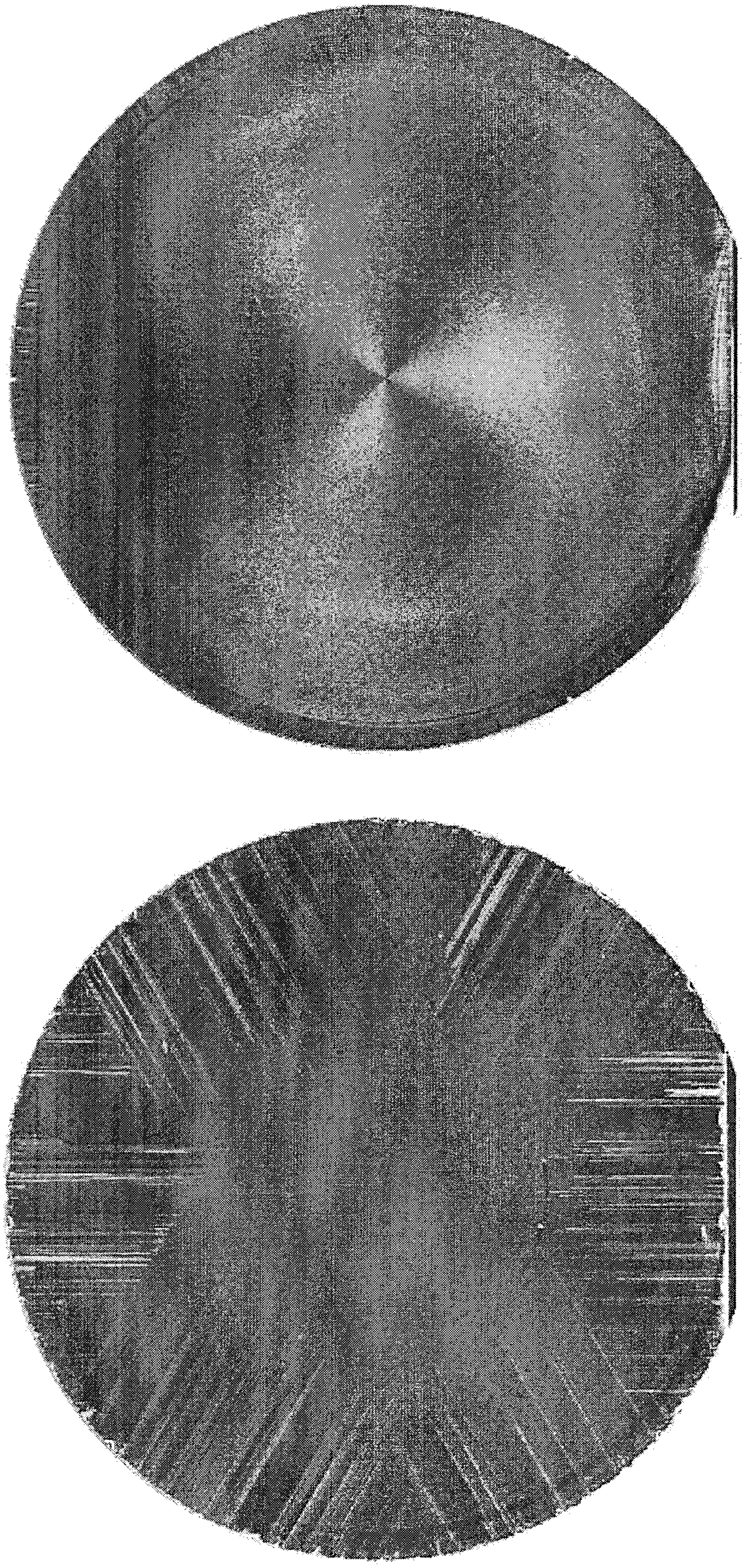
FIG. 12 is a laser scattering image of the top surface of each of samples 2 and 8 in the first example of the present invention.

FIG. 12 is a laser scattering image of the top surface of each of samples 2 and 8 in the first example of the present invention. FIG. 12(*a*) is a laser scattering image of the top surface of sample 2. FIG. 12(*b*) is a laser scattering image of the top surface of sample 8.

Referring to FIG. 12, each thickness W of samples 2 and 8 is 8 micrometers. A slight occurrence of cracks was observed in the area near the peripheral end (an area where the distance from the peripheral end is 5 millimeters or less) of the top surface of sample 2. No occurrence of cracks was observed in other areas. On the other hand, huge cracks occurred throughout on the top surface of sample 8.

Figure 13:
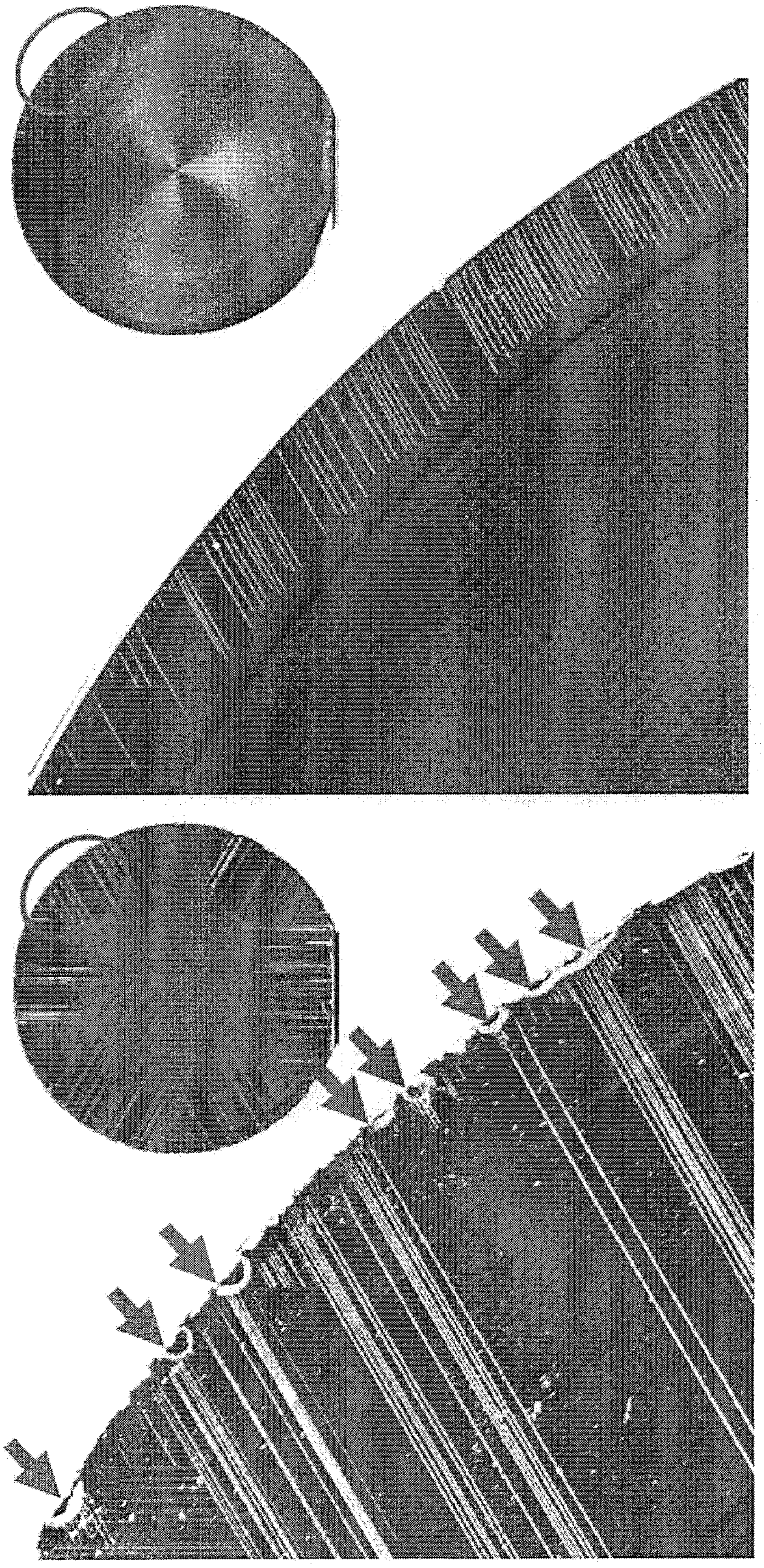
FIG. 13 is a partial enlargement figure of the laser scattering image shown in FIG. 12.

FIG. 13 is a partial enlargement figure of the laser scattering image shown in FIG. 12. FIG. 13(*a*) is a partial enlargement figure of the laser scattering image shown in FIG. 12(*a*). FIG. 13(*b*) is a partial enlargement figure of the laser scattering image shown in FIG. 12(*b*).

Referring to FIG. 13, no trace of meltback etching was found on the top surface of sample 2. On the other hand, metallized Si was exposed at the bottom of the cracks near the peripheral end of the top surface of sample 8 (the portion indicated by the arrows in FIG. 13(*b*)). Metallized Si is a trace of meltback etching generated.

Figure 14:
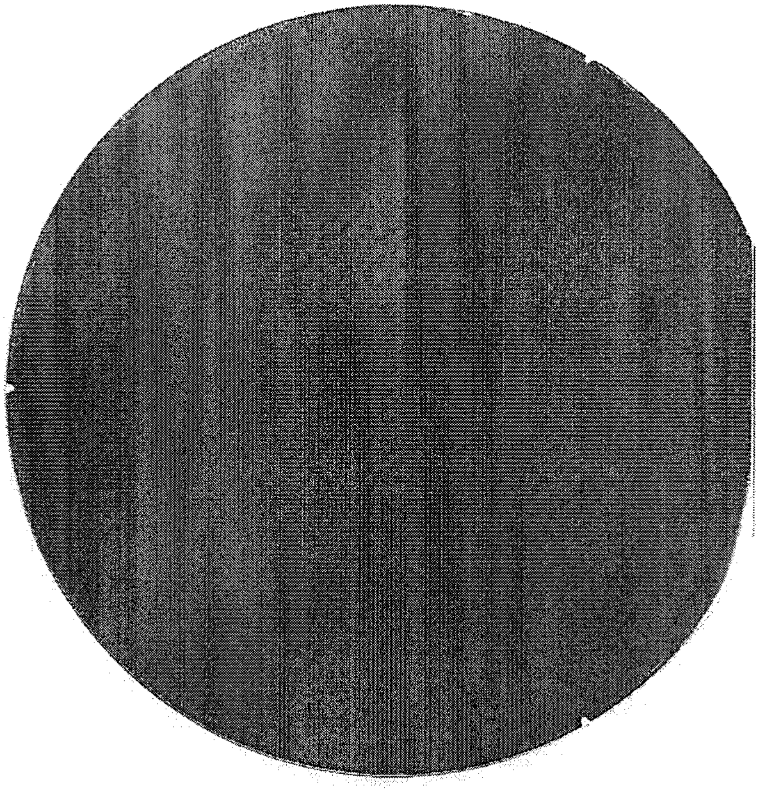
FIG. 14 is laser scattering images of the top surface of each of samples 3 and 9 in the first example of the present invention.
Figure 14:
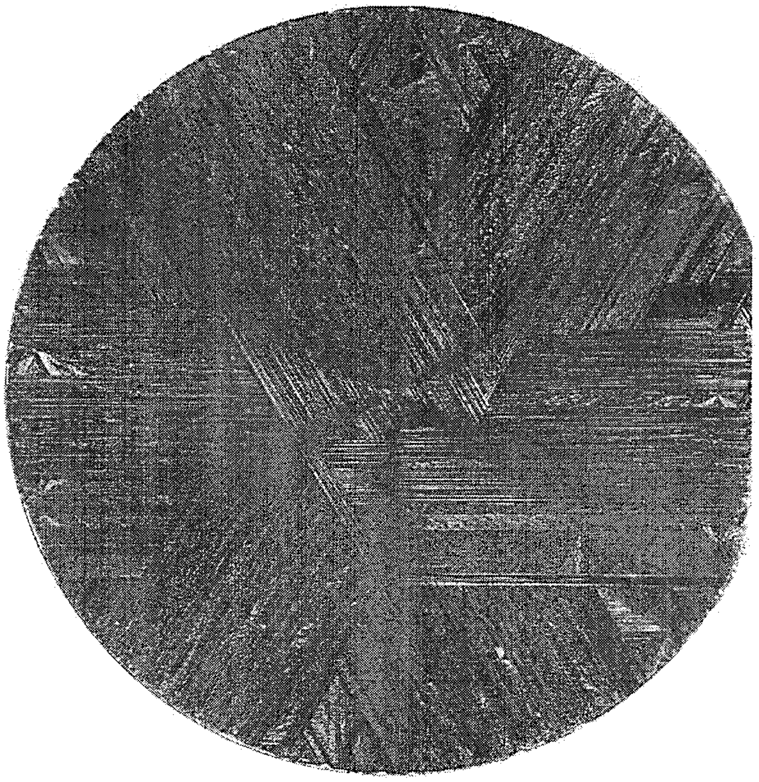

FIG. 14 is laser scattering images of the top surface of each of samples 3 and 9 in the first example of the present invention. FIG. 14(*a*) is a laser scattering image of the top surface of sample 3. FIG. 14(*b*) is a laser scattering image of the top surface of sample 9.

Referring to FIG. 14, each thickness W of samples 3 and 9 is 8 micrometers. A slight occurrence of cracks was observed in the area near the peripheral end (an area where the distance from the peripheral end is 5 millimeters or less) of the top surface of sample 3. No occurrence of cracks was observed in other areas. No trace of meltback etching was found on the top surface of sample 3. On the other hand, huge cracks occurred throughout on the top surface of sample 9.

From the results of FIGS. 11 to 14, according to samples 1 to 3, even if the thickness W is 6 micrometers or more, it is possible to suppress the occurrence of cracks into areas other than the area where the distance from the peripheral end is 5 millimeters or less of the top surface of the compound semiconductor substrate. It can be seen that samples 1 to 3 can suppress the occurrence of meltback etching over the entire top surface of the compound semiconductor substrate.

Next, the inventors of the present application produced compound semiconductor device DC4 using the obtained sample 3. Then, cutoff frequency of the produced compound semiconductor device DC4 was measured at room temperature. Here, the composition of barrier layer 8 is $Al_{0.26}Ga_{0.74}N$.

Compound semiconductor device DC4 was produced by the following method. First, the peripheral region of the device was isolated. For this element isolation, the sample 3 was deep mesa etched from the surface of the sample 3 to a depth of 300 nanometers using $BCl_3$ plasma-based reactive ion etching (RIE) technology.

Subsequently, ultraviolet (UV) photolithography and electron beam deposition method were used to deposit Ti/Al/Ni/Au metal stacks. Hence, source electrode 11 and drain electrode 12 were formed. The ohmic contacts between each of source electrode 11 and drain electrode 12, and the surface of sample 3 was made by performing the rapid thermal annealing (RTA) in $N_2$ atmosphere with 850 degrees Celsius, 30 seconds. Gate electrode 13 as a Schottky electrode was formed by depositing a Ni/Au metal stack using the electrons beam deposition method.

The gate pad was formed in the area deep mesa-etched from the surface of sample 3 to a depth of 300 nanometers. For this reason, the effective nitride layer thickness corresponding to S-parameter measurements of the open-gate pad described below is 7.7 micrometers.

When measuring cutoff frequency, a device in which two gate electrodes 13 were formed in parallel was used. The gate electrode 13 had a gate length of 2 micrometers and a gate width of 50 micrometers. The cutoff frequency was measured using "P5400A vector network analyzer (registered trademark)" manufactured by "Keysight Technologies (registered trademark)". The measurement system was accurately calibrated with open-short-load-through calibration standards.

The cutoff frequency measurements were performed within the frequency range of 0.5-20 GHz, with the device turned on (ON) by applying a drain voltage of 10V and a gate voltage of −0.8V. Hence, a frequency dependence curve of the current gain ($|H21|$) was obtained. Next, data plotting the values of $|H21|^2$ against the logarithm of frequency were linearly extrapolated, and the frequency at which $|H21|=0$ dB was determined as the cutoff frequency.

Figure 15:
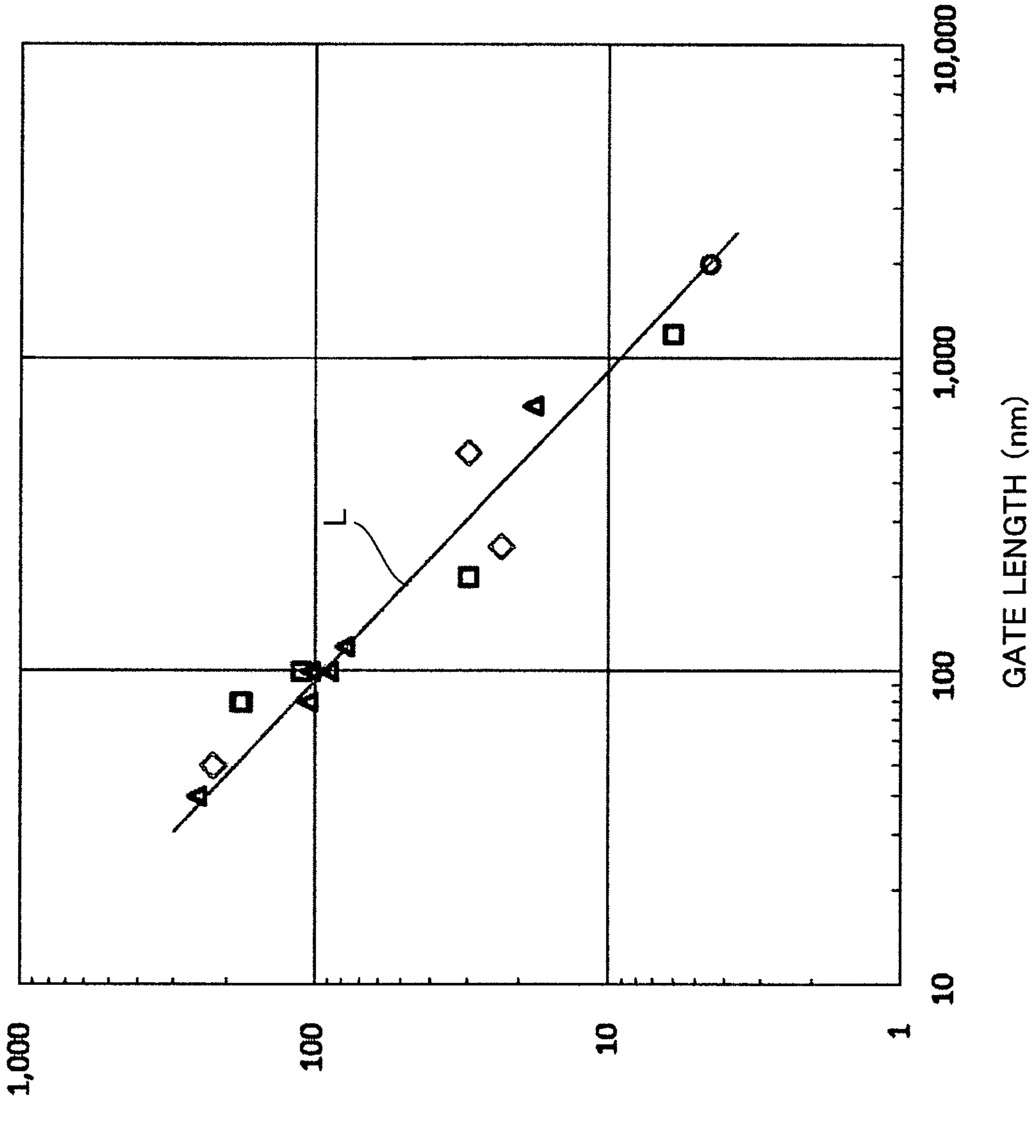
FIG. 15 is a diagram showing the relationship between the cutoff frequency and the gate length of compound semiconductor device DC4 manufactured using sample 3 in the first example of the present invention.
Figure 23:
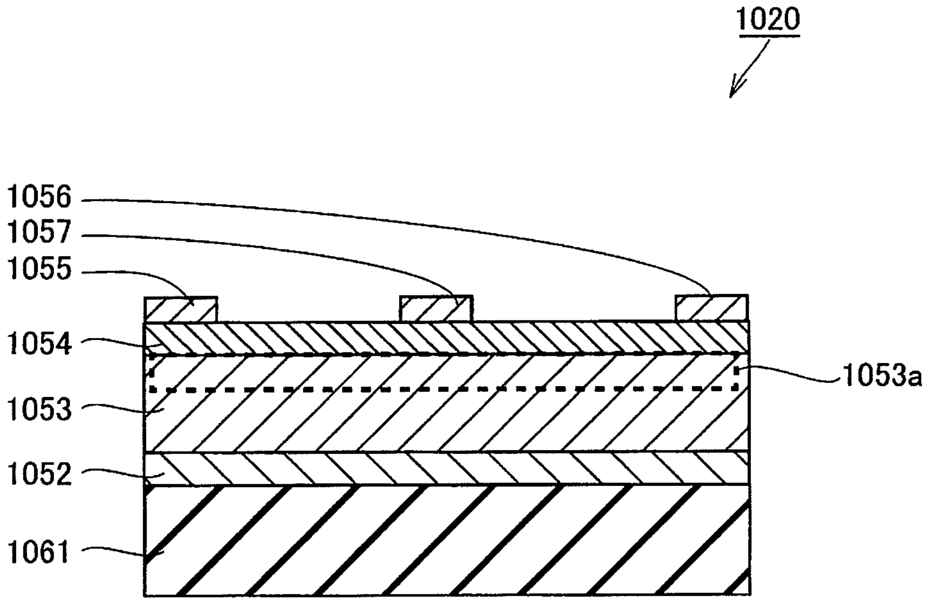
FIG. 23 is a cross-sectional view schematically showing the second example of a conventional HEMT structure.
Figure 24:
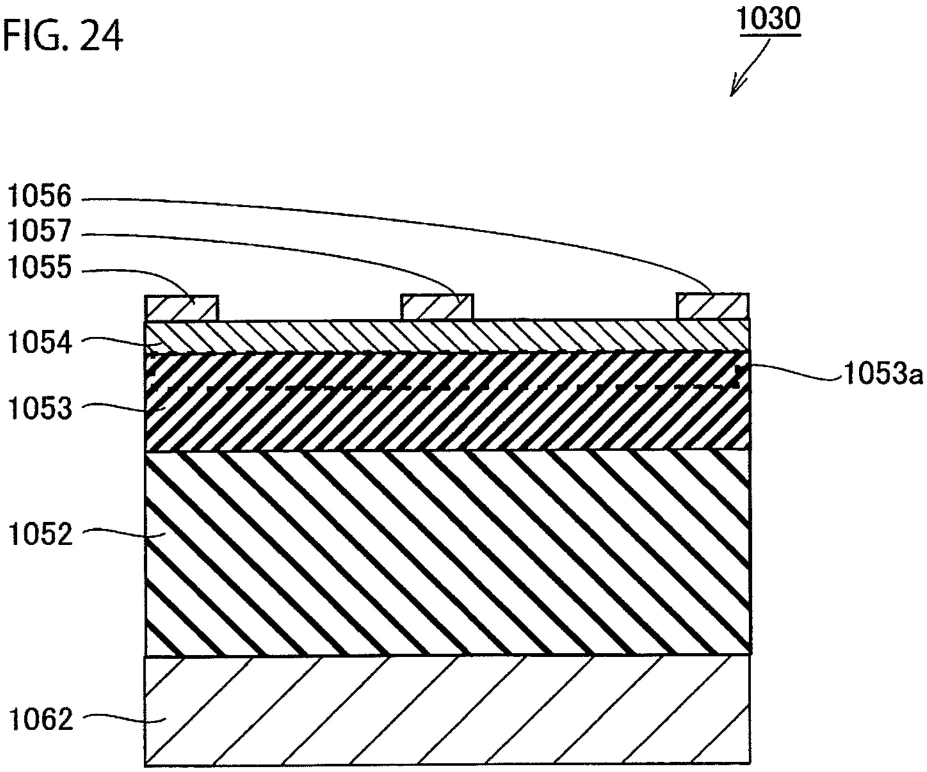
FIG. 24 is a cross-sectional view schematically showing the third example of a conventional HEMT structure.

FIG. 15 is a diagram showing the relationship between the cutoff frequency and the gate length of compound semiconductor device DC4 manufactured using sample 3 in the first example of the present invention. FIG. 15 also shows the relationship between the cutoff frequency and the gate length of a conventional compound semiconductor device for high frequency applications. The circle plots in FIG. 15 shows the relationship between the cutoff frequency and the gate length of the compound semiconductor device DC4 produced using sample 3. The diamond-shaped plots in FIG. 15 shows the relationship between the cutoff frequency and the gate length of the HEMT 1010 shown in FIG. 22. The triangular plots in FIG. 15 show the relationship between the cutoff frequency and the gate length of the HEMT 1020 shown in FIG. 23. The square plots in FIG. 15 shows the relation between the cutoff frequency and the gate length of the HEMT 1020 shown in FIG. 23 with a thin SiC layer added between Fz-Si substrate 1061 and nitride buffer layer 1052.

Referring to FIG. 15, straight line L connecting multiple plots showing the relationship between the cutoff frequency and the gate length of the compound semiconductor device for conventional high-frequency applications was drawn. Plotted dots showing the relationship between the cutoff frequency and the gate length of compound semiconductor device DC4 fabricated using sample 3 is on the straight line L. From this result, it can be seen that compound semiconductor device DC4 has high frequency characteristics comparable to compound semiconductor devices for conventional high-frequency applications.

Next, the inventors prepared each of compound semiconductor devices DC3 and DC4 using each of samples 2 and 3 in the same manner as for the measurement of cutoff frequency (the case shown in FIG. 15). Then, the small signal characteristics change by temperature of each of the fabricated compound semiconductor devices DC3 and DC4 was evaluated. In particular, the S parameter S11 for the gate open pad structure was measured at each temperature of 25 degrees Celsius, 50 degrees Celsius, 75 degrees Celsius, 100 degrees Celsius, and 125 degrees Celsius. The measurement of S parameters was performed using "P5400A vector network analyzer (registered trademark)" manufactured by "Keysight Technologies (registered trademark)". The measurement system was accurately calibrated with open-short-load-through calibration standards.

When measuring the S parameter S11, a device in which only the gate pads were formed without gate electrodes on the electronic traveling layer, that is, a gate open pad structured device was used. The area of the gate pad region was $4.9*10^5$ $cm^2$.

The gate pad was formed in the area deep mesa-etched from the surface of sample 3 to a depth of 300 nanometers. For this reason, the effective nitride layer thickness for the open gate pad S-parameter measurements is 7.7 micrometers.

Figure 16:
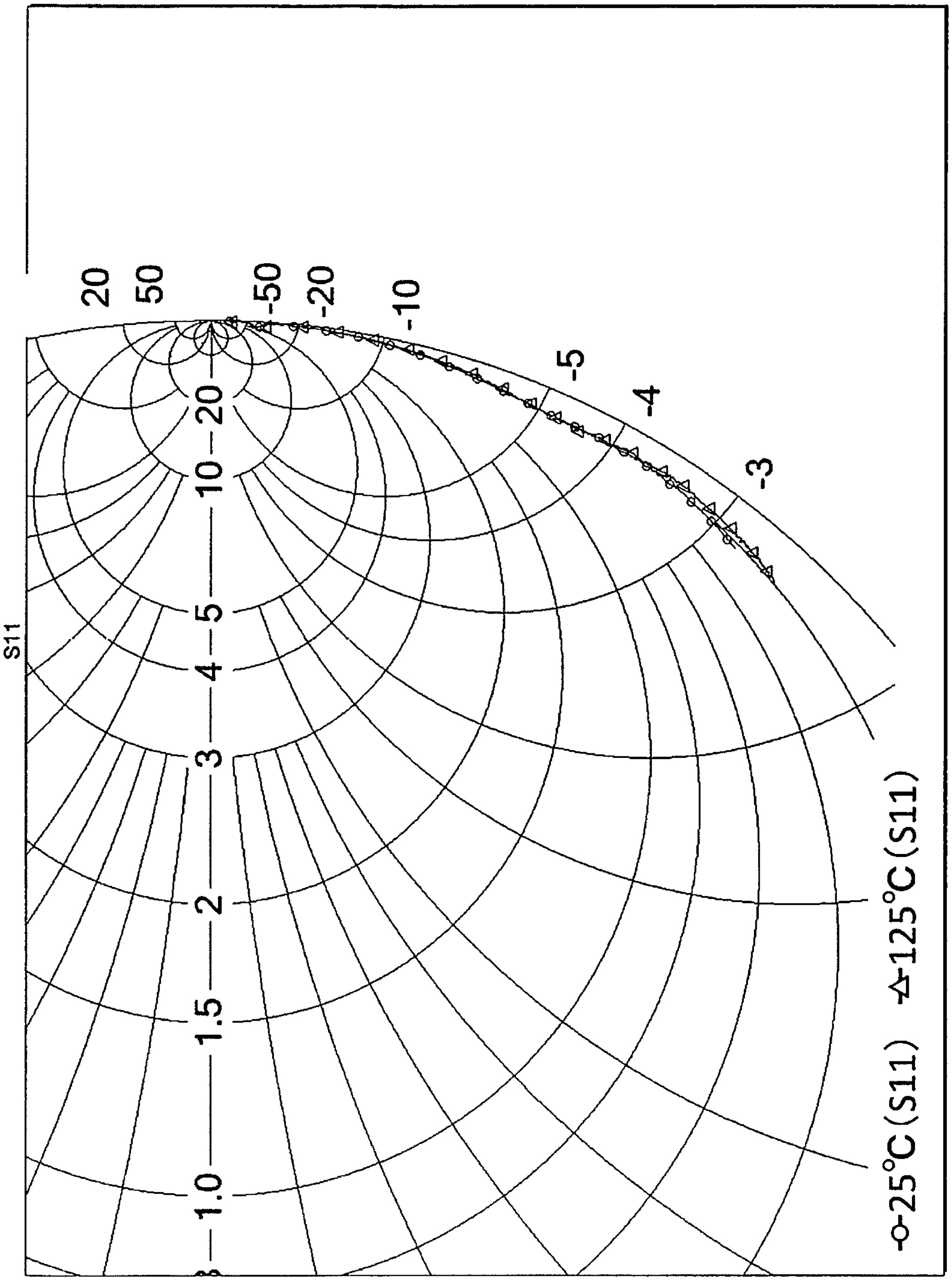
FIG. 16 is a diagram showing the frequency characteristics of the S parameter S11 of sample 2 in the first example of the present invention.
Figure 17:
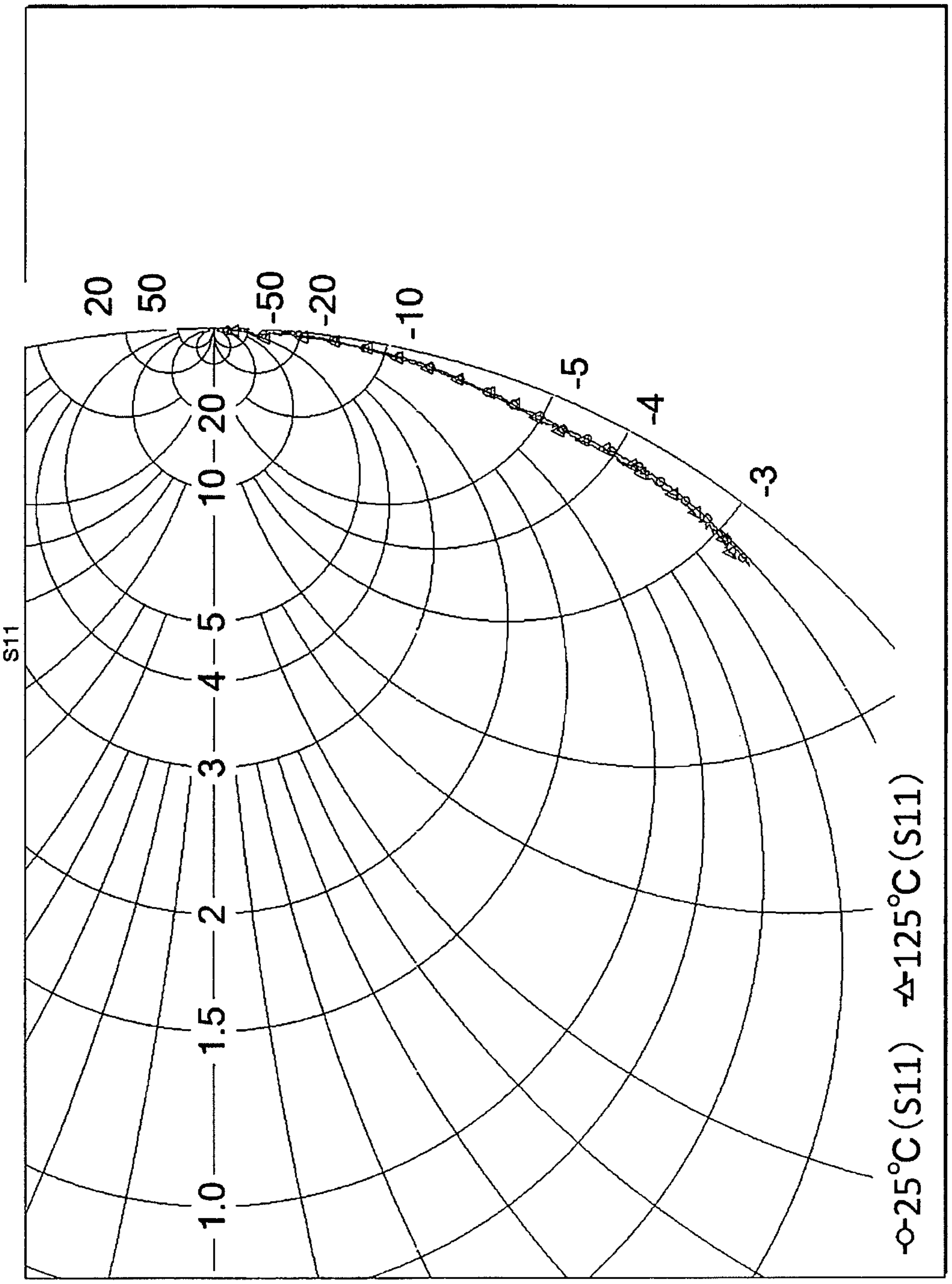
FIG. 17 is a diagram showing the frequency characteristics of the S parameter S11 of sample 3 in the first example of the present invention.

FIG. 16 is a diagram showing the frequency characteristics of the S parameter S11 of sample 2 in the first example of the present invention. FIG. 17 is a diagram showing the frequency characteristics of the S parameter S11 of sample 3 in the first example of the present invention. In FIGS. 16 and 17, only the S-parameters S11 at temperatures of 25 degrees Celsius and 125 degrees Celsius respectively are shown.

Referring to FIGS. 16 and 17, the frequency dependence curves of the S parameter S11 were obtained in the frequency domain of 0.5 to 20 GHz using the gate open pad structured device described above, and plotted on a Smith chart.

As is clear from FIGS. 16 and 17, the S parameters S11 of samples 2 and 3 exhibited substantially constant behavior regardless of temperature. From this result, it can be seen that, unlike the conventional HEMT 1020 shown in FIG. 23 and the like, the compound semiconductor devices DC3 and DC4 exhibit less attenuation of high frequency signals even at high temperatures, as at room temperature.

Further, a simple RC series circuit fitted to the data in FIG. 17 yielded the measured pad capacitance and resistance values of 0.059 pF and 9.5Ω, respectively. The pad resistance of 9.5Ω is a sufficiently high resistance per unit area when normalized by the area of the gate pad region of $4.9*10^{-5}$ $cm^2$. From this, it can be seen that in sample 3, parasitic conduction elements that lead to deterioration of high frequency characteristics are sufficiently suppressed.

The capacitance of the pad was normalized by the area of the gate pad, and using the normalized value, the thickness of the highly insulating portion of the nitride was estimated as the thickness of the dielectric layer of the pad capacitance. As a result, the estimated value was 7.1 micrometers. This value is close to 7.7 micrometers, which is the effective nitride layer thickness for the S-parameter measurements of the gate pad. From this, it can be seen that in sample 3, most of the nitride layer maintains the properties of a dielectric layer (that is, semi-insulating or sufficiently high resistance).

In this way, when a thick nitride layer is formed on a thick SiC layer in the configuration of the present application, most of the nitride layer can maintain properties of a dielectric layer, that is, semi-insulating or sufficiently high resistance. Further, by providing a SiC layer underneath the nitride layer, the nitride layer can be made sufficiently thick so that the degradation of high frequency characteristics is small. As a result, high frequency performance of the device can be improved. Further, the attenuation of high frequency signals can be reduced at high temperatures as well as at room temperature.

As a second example, the inventors of the present application manufactured a structure similar to that of compound semiconductor substrate CS3 shown in FIG. 8 under two different manufacturing conditions, and obtained samples 10 and 11, respectively. Samples 10 and 11 were manufactured using a 6 inch Si substrate made by the Cz method.

Sample 10: When forming each of the C—GaN layers 51*a*, 51*b*, and 51*c*, the film forming temperature was set to a high temperature (about 200 degrees Celsius lower temperature than growth temperature of a GaN layer which is not doped with C) and hydrocarbon was introduced as C source gas. The sum total thickness W of first nitride semiconductor layer 4, second nitride semiconductor layer 5, and electronic traveling layer 6 was set to 7 micrometers.

Sample 11: When forming each of the C—GaN layers 51*a*, 51*b*, and 51*c*, the film forming temperature was set to a low temperature (about 300 degrees Celsius lower temperature than growth temperature of a GaN layer which is not doped with C) and C source gas was not introduced. The sum total thickness W of first nitride semiconductor layer 4, second nitride semiconductor layer 5, and electronic traveling layer 6 was set to 7 micrometers.

Subsequently, the inventors of the present application visually confirmed the presence or absence of cracks into compound semiconductor substrate CS3. As a result, cracks did not occur in any of samples 10 and 11.

Subsequently, the inventors of the present application confirmed the presence or absence of meltback etching (a phenomenon that a crystal is altered by the reaction between Si and Ga) to Si substrate 1 of compound semiconductor substrate CS3 by observation with an optical microscope. As a result, meltback etching did not occur in any of samples 10 and 11 (Both of samples 10 and 11 satisfied meltback-free on the entire surface of the substrate).

Next, for each of C—GaN layers 51*a*, 51*b*, and 51*c* of compound semiconductor substrate CS3, the inventors of the present application measured the carbon concentration distribution in the depth direction at center PT1 and the carbon concentration distribution in the depth direction at edge PT2. SIMS (Secondary Ion Mass Spectrometry) was used for this measurement. Next, based on the measured carbon concentration distribution, concentration C1 that is the carbon concentration at the center position in the depth direction at center PT1 and concentration C2 that is the carbon concentration at the center position in the depth direction at edge PT2 were calculated. Next, concentration error ΔC represented by ΔC (%)=|C1−C2|*100/C1 was calculated based on the calculated concentrations C1 and C2.

Figures 18, 19, 20:
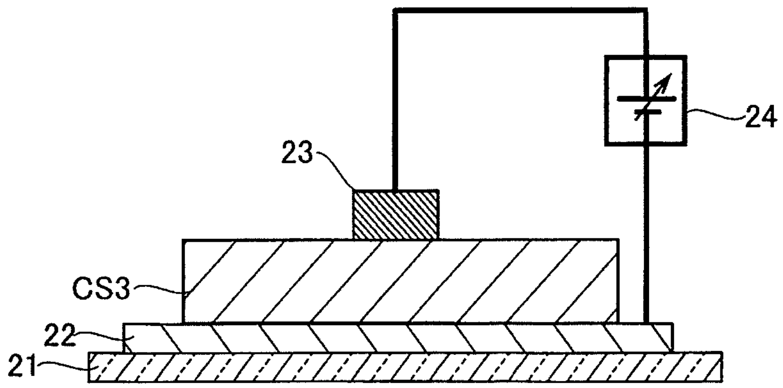
FIG. 18 is a diagram showing values of concentration error ΔC calculated in the second example of the present invention.
FIG. 19 is a diagram showing values of the film thickness error ΔW calculated in the second example of the present invention.
FIG. 20 is a cross-sectional view showing a method of measuring intrinsic breakdown voltage in the second example of the present invention.

FIG. 18 is a diagram showing values of concentration error ΔC calculated in the second example of the present invention.

Referring to FIG. 18, in sample 10, the range of the carbon concentration in the depth direction at center PT1 of each of C—GaN layers 51*a*, 51*b*, and 51*c* is $4*10^{18}$ atoms/$cm^2$ or more and $8*10^{18}$ atoms/$cm^2$ or less, and the range of the carbon concentration in the depth direction at edge PT2 is $4.3*10^{18}$ atoms/$cm^2$ or more and $7*10^{18}$ atoms/$cm^2$ or less.

In sample 10, the carbon concentration of center PT1 and the carbon concentration of edge PT2 are almost the same value, and concentration errors ΔC of C—GaN layers 51*a*, 51*b* and 51*c* are 33%, 21% and 0% respectively. The inventors of the present application manufactured a plurality of sample 10 and measured the concentration errors ΔC of the obtained plurality of sample 10 by the method described above. As a result, all sample 10 had concentration error ΔC values within the range of 0 or more and 50% or less.

On the other hand, in sample 11, the range of the carbon concentration in the depth direction at center PT1 of each of C—GaN layers 51*a*, 51*b*, and 51*c* was $5*10^{18}/cm^2$ or more and $1.5*10^{19}/cm^2$ or less, and the range of the carbon concentration in the depth direction at edge PT2 was $2.3*10^{19}/cm^2$ or more and $4.2*10^{19}/cm^2$ or less. In sample 11, the carbon concentration of edge PT2 was higher than the carbon concentration of center PT1, and concentration errors ΔC of C—GaN layer 51*a*, 51*b*, and 51*c* were 448%, 312%, and 258%, respectively.

From the above results, it can be seen that the in-plane uniformity of the carbon concentration of the C—GaN layer is improved in sample 10, as compared to sample 11.

Next, the inventors measured each of film thickness W1 which is the film thickness at center PT1 and film thickness W2 which is the film thickness at edge PT2 for each of C—GaN layers 51*a*, 51*b*, and 51*c* of compound semiconductor substrate CS3. This measurement was performed by observing the cross section of compound semiconductor substrate CS3 using a TEM (Transmission Electron Microscope). Next, film thickness error ΔW expressed as ΔW (%)=|W1−W2|*100/W1 was calculated based on the measured film thicknesses W1 and W2.

FIG. 19 is a diagram showing values of the film thickness error ΔW calculated in the second example of the present invention.

Referring to FIG. 19, in sample 10, the film thickness errors ΔW of each of C—GaN layers 51*a*, 51*b* and 51*c* are 3.9%, 1.8% and 1.2% respectively, all of which are small values. The inventors of the present application manufactured a plurality of sample 10 as samples 10, and measured the film thickness errors ΔW of each of the obtained plurality of samples 10 by the method described above. As a result, for all samples 10, the film thickness error ΔW was within the range of 0 to 8%.

On the other hand, as for sample 11, the film thickness errors ΔW of each of C—GaN layers 51*a*, 51*b*, and 51*c* were 9%, 11%, and 11%, respectively, all of which were large values.

From the above results, it can be seen that in-plane uniformity of the film thickness of the C—GaN layer is improved for sample 10, as compared to sample 11.

Next, the inventors measured intrinsic breakdown voltage of each of samples 10 and 11. Measurement of intrinsic breakdown voltage was performed by the following method.

FIG. 20 is a cross-sectional view showing a method of measuring intrinsic breakdown voltage in the second example of the present invention.

Referring to FIG. 20, sample compound semiconductor substrate CS3 to be measured was fixed on copper plate 22 attached on glass plate 21. An electrode 23 made of Al was provided on the barrier layer 8 of the fixed compound semiconductor substrate CS3 so as to be in contact with the barrier layer 8.

Using an electrode with a sufficiently small area as electrode 23 (specifically, an electrode with a diameter of 0.1 cm), electrode 23 is brought into contact with four different positions on the surface of barrier layer 8 in compound semiconductor substrate CS3 in order. The density of the current flowing between the copper plate 22 and the electrode 23 (current flowing through the sample in the vertical direction) was measured when the electrode 23 was brought into contact with each of the positions. When the density of the measured current reached $1*10^{-1}$ A/millimeter$^2$, the sample was considered to have dielectric breakdown, and the voltage between the copper plate 22 and the electrode 23 at this time was measured. The highest and lowest values among the obtained four voltages were excluded, and the average value of the remaining two values was taken as the intrinsic breakdown voltage. A plurality of samples were prepared as samples 10, and the intrinsic breakdown voltage of each sample was measured. As a result, the intrinsic breakdown voltages of all samples 10 were 1200V or more and 1600V or less.

Furthermore, the inventors of the present application measured the defect density of the GaN layers (any of GaN layers 51*a*, 51*b*, and 51*c*) of the compound semiconductor substrate CS3 by the following method. First, the electrode 23 is sequentially brought into contact with five different positions near the center PT1 on the surface of the barrier layer 8 of the compound semiconductor substrate CS3, and the density of current flowing between the copper plate 22 and the electrode 23 (current flowing through the sample in the vertical direction) when the electrode 23 is brought into contact with each position was measured. When the density of the measured current reached $1*10^{-1}$ A/millimeter$^2$, it was assumed that the sample had dielectric breakdown, and the voltage between the copper plate 22 and the electrode 23 at this time was taken as the insulation breakdown voltage of center PT1. Next, the position where the measured insulation breakdown voltage was 80% or less of the intrinsic insulation breakdown voltage was judged to be the position where the defect was present. The ratio of the number of positions having a defect to the five positions where the insulation breakdown voltages were measured was calculated as the defect density D of center PT1.

Calculation of the above-mentioned defect density D at center PT1 was performed using each of the electrodes with four different areas S (0.283 cm$^2$, 0.126 cm$^2$, 0.031 cm$^2$, 0.002 cm$^2$). As a result, four pairs of the area S of the electrode and the defect density D at the center PT1 were obtained.

Next, the yield Y for each of the four different areas S was calculated using Equation (1), which is a general Poisson equation showing the relationship among the yield Y, the electrode area S, and the defect density D.

$$Y=\exp(-S*D) \tag{1}$$

Next, an electrode with area S whose calculated yield Y is closest to 50% was determined as an optimal electrode for the defect density calculation, and defect density D corresponding to optimal electrode area S was adopted as the defect density of center PT1.

Also, the position to contact electrode 23 was changed to 5 different positions near edge PT2 on the surface of barrier layer 8, and the defect density at edge PT2 was measured in the same manner as described above.

Figures 21, 22:
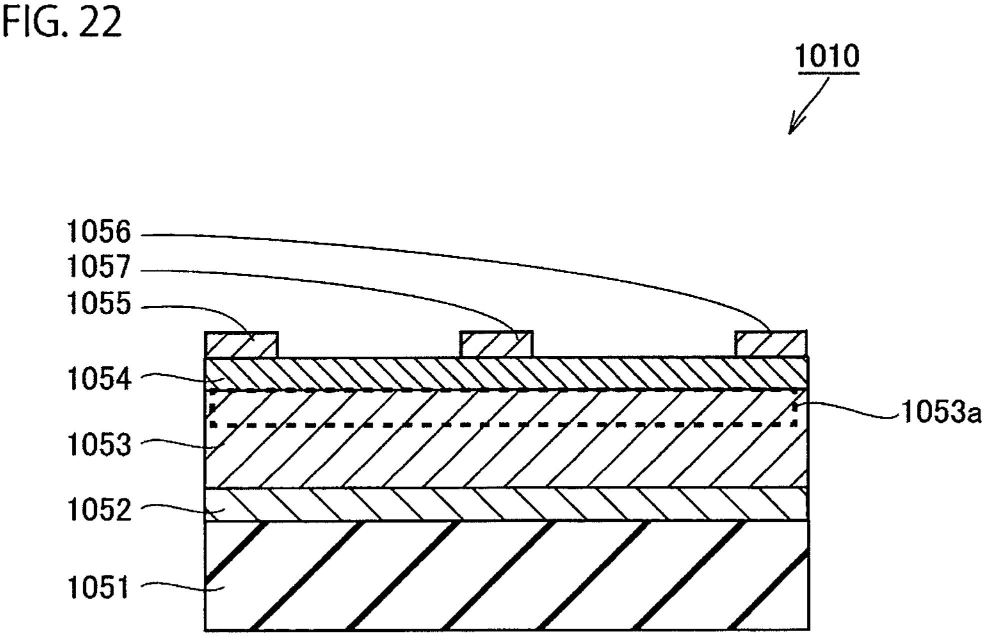
FIG. 21 is a diagram showing the values of the defect density measured in the second example of the present invention.
FIG. 22 is a cross-sectional view schematically showing the first example of a conventional HEMT structure.

FIG. 21 is a diagram showing the values of the defect density measured in the second example of the present invention.

Referring to FIG. 21, the defect density at center PT1 of sample 10 was 1.8/cm$^2$, and the defect density at edge PT2 of sample 10 was 1.8/cm$^2$. The inventors of the present application manufactured a plurality of samples 10 and measured the defect densities at the center PT1 and edge PT2 of each of the obtained plurality of samples 10 by the method described above. As a result, all samples 10 had defect densities in the range of 0 to 7/cm$^2$. On the other hand, the defect density at center PT1 of sample 11 was 207/cm$^2$, and the defect density at edge PT2 of sample 11 was 7.1/cm$^2$.

From the above results, it can be seen that sample 10 has a lower defect density in the GaN layer than sample 11.

[Others]

The compound semiconductor substrates of the above embodiments are not limited to high frequency device applications, but are also suitable for power device applications. When the compound semiconductor substrates of the above embodiments are used for power devices, vertical leakage current can be reduced.

In each of compound semiconductor substrates CS1, CS2, CS3, and CS4, Si substrate 1 and SiC layer 2 may be replaced with a conductive SiC substrate having a resistivity of 0.1 Ωcm or more and less than 1*10$^5$ Ωcm. Also in this case, due to the action of the C—GaN layer 51 and the intermediate layer 52, while increasing the insulation of the nitride semiconductor layer, the occurrence of warpage and cracks can be suppressed. As a result, a compound semiconductor substrate and a compound semiconductor device having high quality can be provided.

The configurations and manufacturing methods in above embodiments, modifications and examples can be combined as appropriate. For example, the configurations of FIG. 2, FIG. 6, FIG. 7, or FIG. 8 may be applied as first nitride semiconductor layer 4 of each of compound semiconductor substrates CS1, CS2, CS3, and CS4. As second nitride semiconductor layer 5 of each of compound semiconductor substrates CS1, CS2, CS3, and CS4, the configuration of FIG. 1, the configuration of FIG. 5, or the like may be applied.

The above-described embodiments, modifications, and examples should be considered illustrative in all respects and not restrictive. The scope of the present invention is shown not by the above description but by the scope of the claims, and is intended to include meanings equivalent to the scope of the claims and all modifications within the scope.

EXPLANATION OF SYMBOLS

1 Si (silicon) substrate (an example of a Si substrate)
2 SiC (silicon carbide) layer (an example of a SiC layer)
4 first nitride semiconductor layer (an example of a first nitride semiconductor layer)
4*a*, 4*b* AlGaN (aluminum gallium nitride) layer second nitride semiconductor layer (an example of a second nitride semiconductor layer)
6, 1053 electronic traveling layer (an example of an electrons traveling layer)
6*a*, 1053*a* two dimensional electron gas
8, 1054 a barrier layer (an example of a barrier layer)
11, 1055 source electrode (an example of a first electrode)
12, 1056 drain electrode (an example of a second electrode)
13, 1057 gate electrode (an example of a third electrode)
21 glass plate
22 copper plate
23 electrode
40, 44, 45 AlN (aluminum nitride) layer
41 $Al_{0.75}Ga_{0.25}N$ layer
42 $Al_{0.5}Ga_{0.5}N$ layer
43 $Al_{0.25}Ga_{0.75}N$ layer
51, 51*a*, 51*b*, 51*c* C—GaN (gallium nitride) layer (an example of a main layer)
52, 52*a*, 52*b* intermediate layer (an example of an intermediate layer)
1051 SiC substrate
1052 nitride buffer layer
1061 Fz-Si substrate
1062 n-type SiC substrate
CS1, CS2, CS3, CS4 compound semiconductor substrate (an example of a compound semiconductor substrates)
DC1, DC2, DC3, DC4 compound semiconductor device (an example of a compound semiconductor device)
PT1 center
PT2 edge

The invention claimed is:

1. A compound semiconductor substrate comprising:
a Si substrate with O concentration of 3*10$^7$/cm$^3$ or more and 3*10$^{18}$/cm$^3$ or less,
a SiC layer formed on the Si substrate,
a first nitride semiconductor layer made of $Al_xGa_{1-x}N$ ($0.1 \le x \le 1$), formed on the SiC layer and including an insulating or semi-insulating layer,
a second nitride semiconductor layer formed on the first nitride semiconductor layer and including a main layer comprising of insulating or semi-insulating $Al_yGa_{1-y}N$ ($0 \le y < 0.1$),
an electronic traveling layer formed on the second nitride semiconductor layer and made of $Al_zGa_{1-z}N$ ($0 \le z < 0.1$), and
a barrier layer formed on the electronic traveling layer and having a wider band gap than a band gap of the electronic traveling layer, wherein
a sum total thickness of the first and second nitride semiconductor layers and the electronic traveling layer is 6 micrometers or more and 10 micrometers or less,
the first nitride semiconductor layer includes a low concentration region made of $Al_xGa_{1-x}N$ ($0.1 \le x \le 0.4$) having a thickness of 0.5 micrometer or more,
the low concentration region has a Si concentration of 0 atoms/cm$^3$ or more and 2*10$^{16}$ atoms/cm$^3$ or less, an O concentration of 0 atoms/cm$^3$ or more and 2*10$^{16}$ atoms/cm$^3$ or less, and a Mg concentration of 0 atoms/cm$^3$ or more and 2*10$^{16}$ atoms/cm$^3$ or less,
the first nitride semiconductor layer consists of a layer intentionally doped with C, a C concentration in the low concentration region is higher than any of the Si concentration, the O concentration, and the Mg concentration in the low concentration region, and is 5*10$^{19}$ atoms/cm$^3$ or less,
a Si concentration, an O concentration, a Mg concentration, a C concentration and an Fe concentration of the electronic traveling layer are all greater than 0 and less than or equal to 1*10$^{17}$ atoms/cm$^3$,
the first nitride semiconductor layer further includes a high concentration region made of $Al_xGa_{1-x}N$ ($0.4 < x \le 1$),
the high concentration region has a Si concentration of 0 atoms/cm$^3$ or more and 5*10$^{17}$ atoms/cm$^3$ or less, an O concentration of 0 atoms/cm$^3$ or more and 5*10$^{17}$ atoms/cm$^3$ or less, and a Mg concentration of 0 atoms/cm$^3$ or more and 5*10$^{17}$ atoms/cm$^3$ or less,
the main layer has a Si concentration of 0 atoms/cm$^3$ or more and 2*10$^{16}$ atoms/cm$^3$ or less, an O concentration of 0 atoms/$cm^3$ or more and $2*10^{16}$ atoms/$cm^3$ or less, and a Mg concentration of 0 atoms/$cm^3$ or more and $2*10^{16}$ atoms/$cm^3$ or less, a C concentration and/or an Fe concentration in the second nitride semiconductor layer are/is higher than any of the Si concentration, the O concentration, and the Mg concentration in the second nitride semiconductor layer and are/is $5*10^{19}$ atoms/$cm^3$ or less, and the main layer includes a region where a concentration of activated donor ions is 0 atoms/cm3 or more and $2*10^{14}$ atoms/$cm^3$ or less.

2. The compound semiconductor substrate according to claim 1, wherein the second nitride semiconductor layer further includes at least one intermediate layer formed within the main layer and/or on the main layer, the intermediate layer comprising of $Al_yGa_{1-y}N$ ($0.5 \leq y \leq 1$), and the main layer has a C concentration higher than that of the electronic traveling layer and/or a Fe concentration higher than that of the electronic traveling layer.

3. The compound semiconductor substrate according to claim 2, wherein the intermediate layer is two or more layers, and each of the two or more intermediate layers has a thickness of 10 nanometers or more and 30 nanometers or less, and is formed at intervals of 0.5 micrometers or more and 10 micrometers or less.

4. The compound semiconductor substrate according to claim 1, wherein the Si substrate contains B, and has p type conductivity and a resistivity of 0.1 mΩcm or more and 100 mΩcm or less.

5. The compound semiconductor substrate according to claim 1, wherein the SiC layer has a thickness of 0.5 micrometers or more and 2 micrometers or less.

6. The compound semiconductor substrate according to claim 1, wherein a distance between the high concentration region and the SiC layer is less than a distance between the low concentration region and the SiC layer.

7. The compound semiconductor substrate according to claim 1, wherein the first nitride semiconductor layer has a thickness less than or equal to a thickness of the second nitride semiconductor layer.

8. The compound semiconductor substrate according to claim 1, wherein the electronic traveling layer has a thickness of 0.3 micrometers or more.

9. The compound semiconductor substrate according to claim 1, wherein stipulating a least squares plane of a top surface of the compound semiconductor substrate, when a sum total value of distance from the least squares plane to a highest point of the top surface of the compound semiconductor substrate and distance from the least squares plane to a lowest point of the top surface of the compound semiconductor substrate is defined as a warpage amount, the warpage amount is 0 or more and 50 or less micrometers.

10. The compound semiconductor substrate according to claim 1, wherein regions other than an area where a distance from an outer edge of a top surface of the compound semiconductor substrate is 5 millimeters or less do not contain cracks.

11. The compound semiconductor substrate according to claim 1, wherein the compound semiconductor substrate has a disk shape and a diameter of 100 millimeters or more and 200 millimeters or less.

12. The compound semiconductor substrate according to claim 1, wherein a top surface of the compound semiconductor substrate does not contain traces of meltback etching.

13. A compound semiconductor device comprising:

the compound semiconductor substrate according to claim 1, first and second electrodes formed on the barrier layer, and a third electrode which is formed on the barrier layer and controls current flowing between the first electrode and the second electrode according to applied voltage.

* * * * *